(12) United States Patent
Yang et al.

(10) Patent No.: US 10,832,778 B1
(45) Date of Patent: Nov. 10, 2020

(54) NEGATIVE VOLTAGE WORDLINE METHODS AND SYSTEMS

(71) Applicant: SanDisk Technologies LLC, Addison, TX (US)

(72) Inventors: Xiang Yang, San Jose, CA (US); Huai-yuan Tseng, San Jose, CA (US); Deepanshu Dutta, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/455,872

(22) Filed: Jun. 28, 2019

(51) Int. Cl.
*G11C 16/08* (2006.01)
*G11C 16/24* (2006.01)
*G11C 16/04* (2006.01)

(52) U.S. Cl.
CPC .......... *G11C 16/08* (2013.01); *G11C 16/0408* (2013.01); *G11C 16/0466* (2013.01); *G11C 16/24* (2013.01)

(58) Field of Classification Search
CPC . G11C 16/08; G11C 16/0408; G11C 16/0466; G11C 16/24
See application file for complete search history.

(56) References Cited

U.S. PATENT DOCUMENTS

| | | | |
|---|---|---|---|
| 7,813,183 B2* | 10/2010 | Moon | G11C 16/3404 365/185.19 |
| 2015/0117114 A1* | 4/2015 | Wan | G11C 11/5642 365/185.21 |
| 2017/0271021 A1* | 9/2017 | Futatsuyama | G11C 16/10 |

* cited by examiner

*Primary Examiner* — Tri M Hoang
(74) *Attorney, Agent, or Firm* — Dickinson Wright PLLC; Steven Hurles

(57) ABSTRACT

A methodology and structure for driving a selected wordline to a negative voltage without the need for a negative wordline voltage generator. The methodology includes the step of boosting a non-selected wordline to a first positive voltage. The methodology proceeds with holding a selected wordline, which is adjacent to and capacitively coupled with the non-selected wordline, at zero voltage. The methodology continues with floating the selected wordline. The methodology proceeds with driving the non-selected wordline to a lower voltage to shift the selected wordline to less than zero volts due to capacitance effects. The methodology continues with the step of accelerating charge loss in a defective memory cell connected to the selected wordline while at a negative voltage during a soft erase operation.

16 Claims, 12 Drawing Sheets

NEGATIVE VOLTAGE WORDLINE METHODS AND SYSTEMS

TECHNICAL FIELD

This disclosure relates to memory systems, and in particular, to memory methods and systems with a negative wordline voltage for an erase operation.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, such as a source select line and a drain select line.

SUMMARY

This disclosure relates generally to memory systems and methods that drive a selected wordline to a negative voltage using the capacitive coupling of the selected wordline to the adjacent wordlines. Driving the selected wordline to a negative voltage can be done without a negative wordline voltage generator. Aspects of the present disclosure provide an negative voltage method without negative voltage generator circuitry. In an example, neighboring wordline-wordline capacitive coupling effect couples the wordlines and drives down a selected wordline a negative voltage without using voltage generator circuitry. Aspects may achieve a benefit to short term data retention (STDR) and improve threshold voltage (Vt) margin without the cost of the voltage generator circuitry.

An aspect of the disclosed embodiments includes method for non-volatile memory comprising: boosting a non-selected wordline to a first positive voltage, holding a selected wordline at zero volts, the selected wordline being adjacent the non-selected wordline and being capacitively coupled to the non-selected wordline, floating the selected wordline, driving the non-selected wordline to a lower voltage to shift the selected wordline to less than zero volts due to capacitance effects, and accelerating charge loss in a defective memory cell connected to selected wordline while at a negative voltage during a soft erase operation.

An aspect of the disclosed embodiments includes applying a further program pulse to the defective memory cell at an increased level.

An aspect of the disclosed embodiments includes boosting sequential odd non-selected wordlines to the first positive voltage. An aspect of the disclosed embodiments includes floating an even selected wordline that is intermediate the sequential odd non-selected wordlines. An aspect of the disclosed embodiments includes driving includes driving both the sequential odd non-selected wordlines to a reduced voltage to shift the even selected wordline to a negative voltage.

An aspect of the disclosed embodiments includes issuing a program command to control a bitline associated with memory cell connected to the selected wordline, drive both sequential odd non-selected wordlines to a pass voltage, to step the even selected wordline to program voltage, and return the sequential odd non-selected wordlines and the even selected wordline to zero volts after programming, thereafter boosting a non-selected wordline to a first positive voltage and holding a selected wordline at zero volts, the selected wordline being adjacent the non-selected wordline and being capacitively coupled to the non-selected wordline.

An aspect of the disclosed embodiments includes verifying an erase after accelerating charge loss in a defective memory cell.

An aspect of the disclosed embodiments includes boosting sequential odd non-selected wordlines to the first positive voltage, wherein floating includes floating an even selected wordline that is intermediate the sequential odd non-selected wordlines.

An aspect of the disclosed embodiments includes driving a first of the sequential odd non-selected wordlines to zero volts to shift the even selected wordline to a negative voltage and driving a second of the sequential odd non-selected wordlines to a reduced voltage greater than zero.

An aspect of the disclosed embodiments includes boosting the first of the non-selected wordline to at least seven volts.

An aspect of the disclosed embodiments includes the even selected wordline is shifted down to more than five volts while not connected to driver circuitry An aspect of the disclosed embodiments includes a non-volatile memory, having a plurality of even wordlines, a plurality of odd wordlines alternating with ones of the plurality of even wordlines, a plurality of memory cells in a vertical stack connected to the plurality of even wordlines and the plurality of odd wordlines, a bit line connected at one end of the vertical stack of memory cells, and controller circuitry to issue control signals. The controller circuitry can issue signals to boost a non-selected wordline to a first positive voltage, hold a selected wordline at zero volts, the selected wordline being adjacent the non-selected wordline and being capacitively coupled to the non-selected wordline, float the selected wordline, drive the non-selected wordline to a lower voltage to shift the selected wordline to less than zero volts due to capacitance effects; and accelerate charge loss in a defective memory cell connected to selected wordline while at a negative voltage during a soft erase operation.

An aspect of the disclosed embodiments includes the controller being configured to apply a further program pulse to the defective memory cell at an increased level.

An aspect of the disclosed embodiments includes the controller being configured to boost sequential odd non-selected wordlines to the first positive voltage, float an even selected wordline that is intermediate the sequential odd non-selected wordlines, and drive both the sequential odd non-selected wordlines to a reduced voltage to shift the even selected wordline to a negative voltage.

An aspect of the disclosed embodiments includes the controller being configured to issue a program command to control a bitline associated with memory cell connected to the selected wordline, drive both sequential odd non-selected wordlines to a pass voltage, step the even selected wordline to program voltage, return the sequential odd non-selected wordlines and the even selected wordline to zero volts after programming, and boost a non-selected wordline to a first positive voltage and holding a selected wordline at zero volts, the selected wordline being adjacent the non-selected wordline and being capacitively coupled to the non-selected wordline.

An aspect of the disclosed embodiments includes the controller being configured to verify an erase after accelerating charge loss in a defective memory cell.

An aspect of the disclosed embodiments includes the controller being configured to boost sequential odd non-selected wordlines to the first positive voltage, float an even selected wordline that is intermediate the sequential odd non-selected wordlines, and drive a first of the sequential odd non-selected wordlines to zero volts to shift the even selected wordline to a negative voltage and drive a second of the sequential odd non-selected wordlines to a reduced voltage greater than zero.

An aspect of the disclosed embodiments includes the controller being configured to boost the first of the non-selected wordlines includes boosting the first of the non-selected wordline to at least seven volts.

An aspect of the disclosed embodiments includes the even selected wordline is shifted down to more than five volts while not connected to driver circuitry These and other aspects of the present disclosure are disclosed in the following detailed description of the embodiments, the appended claims, and the accompanying figures.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1:
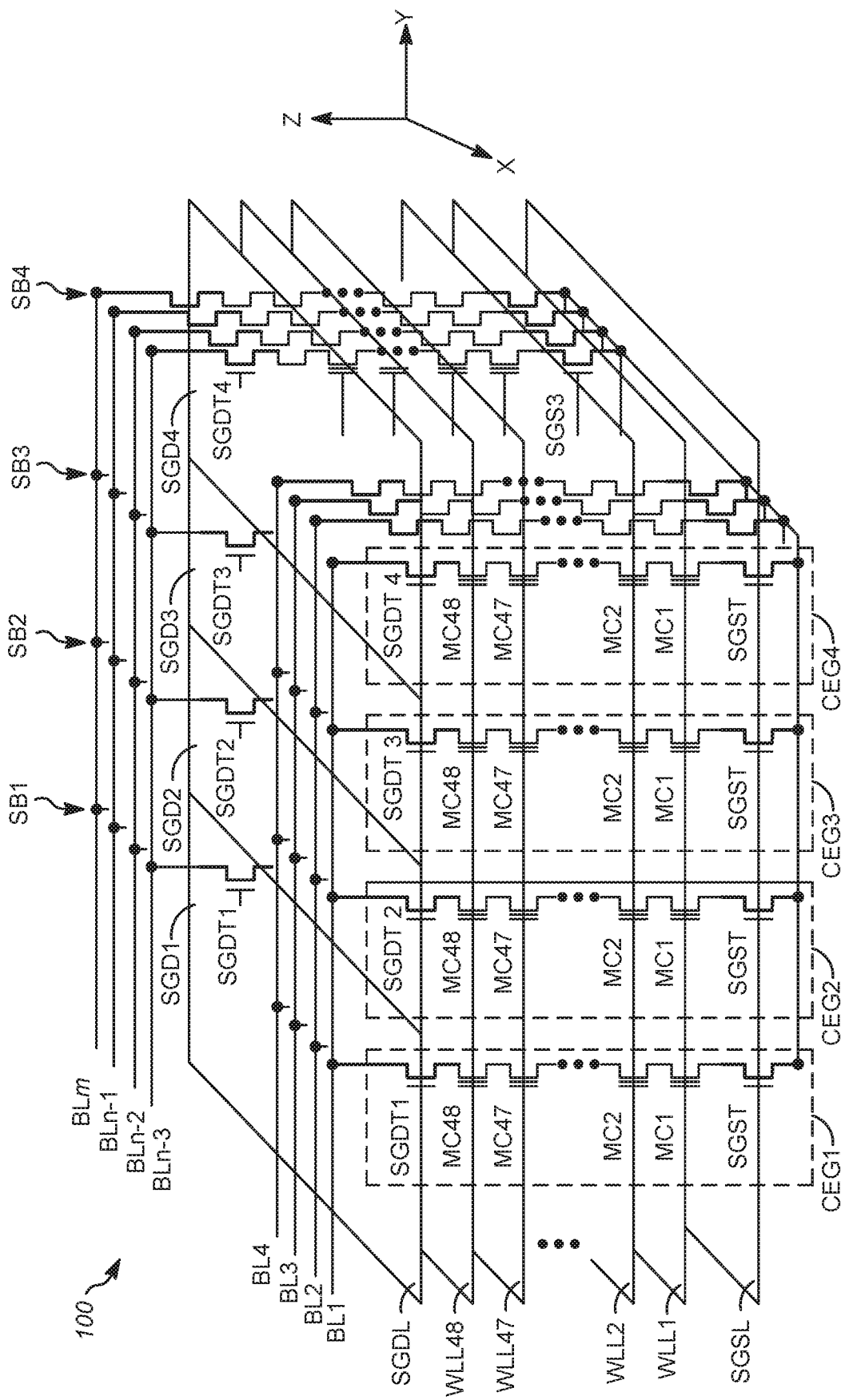
FIG. 1 shows illustrates a circuit schematic diagram of a block of memory cells three-dimensionally arranged into a plurality of NAND strings.
Figure 2A:
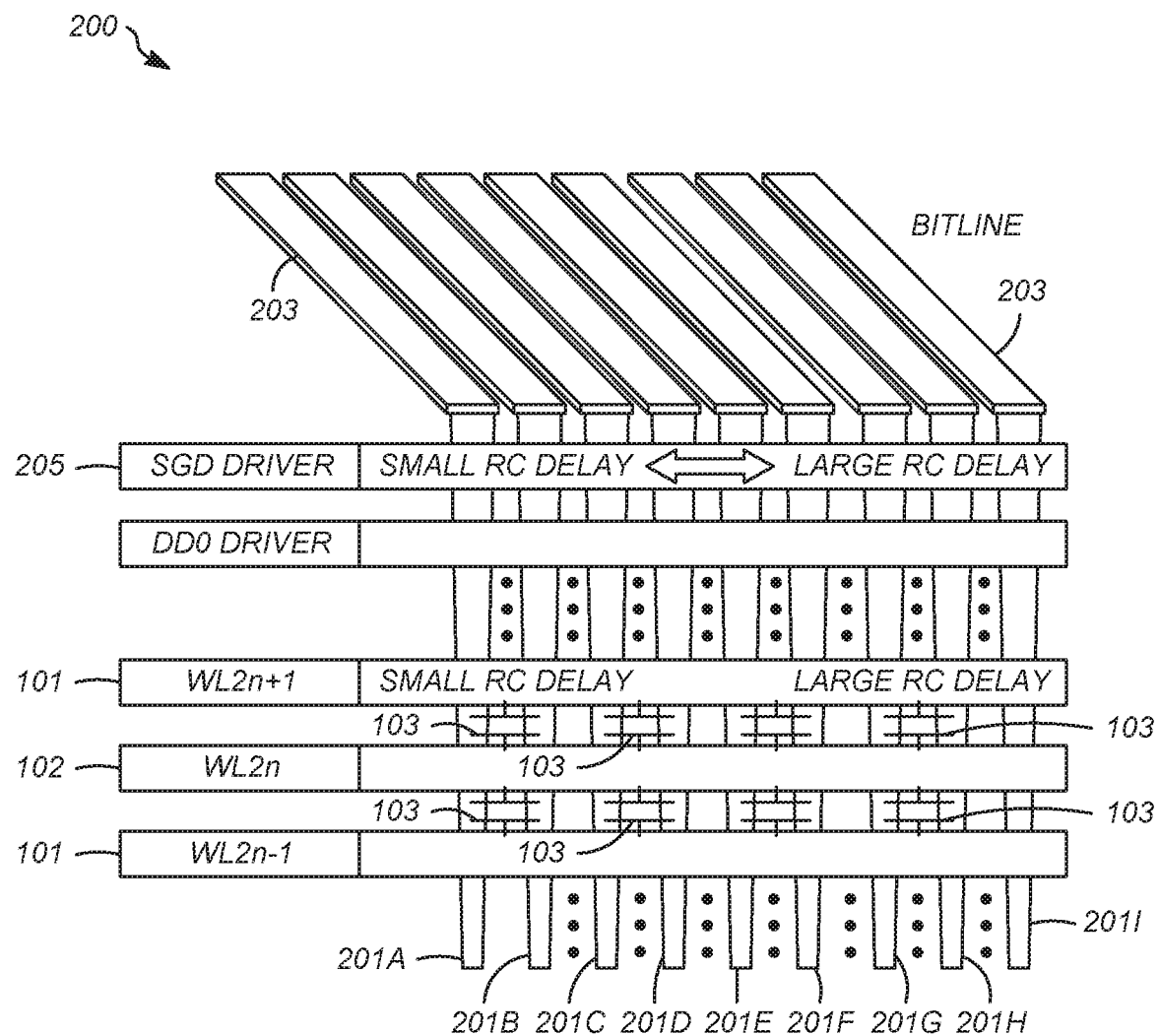
FIG. 2A shows a schematic view of a nonvolatile memory according to an aspect of the present disclosure.

FIG. 1 shows illustrates a circuit schematic diagram 100 of a block of memory cells three-dimensionally arranged into a plurality of NAND strings FIG. 2A illustrates a vertical memory structure 200, which cant implement an erase verify as described herein. As shown in FIG. 2A, an odd wordline signal 101 and an even wordline signal 102 may be applied to odd and even wordlines. The signals 101, 102 charge a wordline for operation using the wordlines, e.g. an erase verify operation. More specifically, the signals 101 and 102 may charge the odd wordlines and the even wordlines from a zero state to an erase verify state, here shown as zero volts and six volts, respectively. The wordlines are significantly longer than they are wide and are closely spaced from the adjacent wordlines, by 70 nm or less, or 45 nm or less. Moreover, the wordlines are made so that they are perfectly stacked one above another. This results in capacitive effects adding to the RC delay in the electrical signal traveling the length of the wordline. The capacitive effect is more pronounced when one wordline is charged and the adjacent two wordlines are not charged. The capacitive effect between the odd wordline 101 and the even wordline 102 is schematically shown at 103 of FIG. 2A.

In the present methodology, there are capacitive effects between adjacent wordlines as they are positioned close together, are vertically aligned, and have the same shape. Charging an adjacent wordline induces charge on the other wordline through capacitance. Thus, the voltage on one wordline can induce a voltage on the other wordline This can be used to induce a negative voltage on a selected wordline by controlling the charge on the adjacent wordline(s). This can be used in an erase operation or a verify operation.

An erase verify is performed to verify that all nonvolatile memory cells in a NAND string are properly erased without overerasing. Typically, a bias voltage is applied to the source of the bottom select gate of the NAND memory cell array and a non-negative erase verify voltage is applied to the control gates of each memory cell during an erase verify. The wordlines can be connected to the control gates of the memory cells. The bias voltage is at least equal to the erased threshold voltage of the worst case memory cell to ensure proper erase verification. If all memory cells are not erased, then another erase operation is performed. Erasing is repeated until the erase verify operation indicates that all memory cells are properly erased. By erasing and verifying according to the present disclosure, the NAND array is completely and properly erased while minimizing overerasing the array.

The near end and far end of the wordlines are defined by the connection to a signal source to apply a signal to the wordline, e.g., positive voltages. The control or power circuitry does not have a negative voltage generator that outputs a negative voltage to the select wordline. The near end of the wordline is closer to the charge connection than the far end of the wordline. A sense device may be connected to just the near end of the wordline. A sense device may be connected to both the near end and the far end of the wordline.

FIG. 2A illustrates a vertical memory structure 200, which can implement the erase verify 100 as described herein. The memory structure 200 shows a plurality of vertically oriented memory strings 201A-201I that are spaced from left to right. A bitline 203 connects to the top of the memory strings 201A-201I, respectively. A NAND string typically includes select gate (SG) transistors at each end. For example, a drain-side select gate (SGD) transistor is at a drain end of the NAND string and a source-side select gate (SGS) transistor is at an opposite source end of the NAND string. The SGD driver circuitry 205 connects to the each of SGD transistors at the top of the memory strings to control the operation of the SGD transistors. The DDO driver also connects to each string and provides a data path to each string. A plurality of odd and even wordlines 101, 102, connect to each vertical memory string, e.g., one wordline for each memory cell in the vertical string. Each of the horizontally extending components, i.e., SGD driver line, DDO line, and wordlines 101, 102 experience a small RC delay at the near end, where they are connected to the respective line and a larger RC delay to the far end of the line. The line can be a conductive layer in the solid-state device. Moreover, each adjacent layer can experience capacitive effects, here shown as capacitors 210 as the line have a significant length, directly overlie each other and are placed closer and closer together with successive generations of fabrication improvements. Thus, the capacitive effect exists between adjacent wordlines. The present disclosure describes using the capacitive effect between adjacent wordlines to generate a negative voltage on a select wordline, without using a wordline generator, using the capacitance between adjacent wordlines.

Figure 2B:
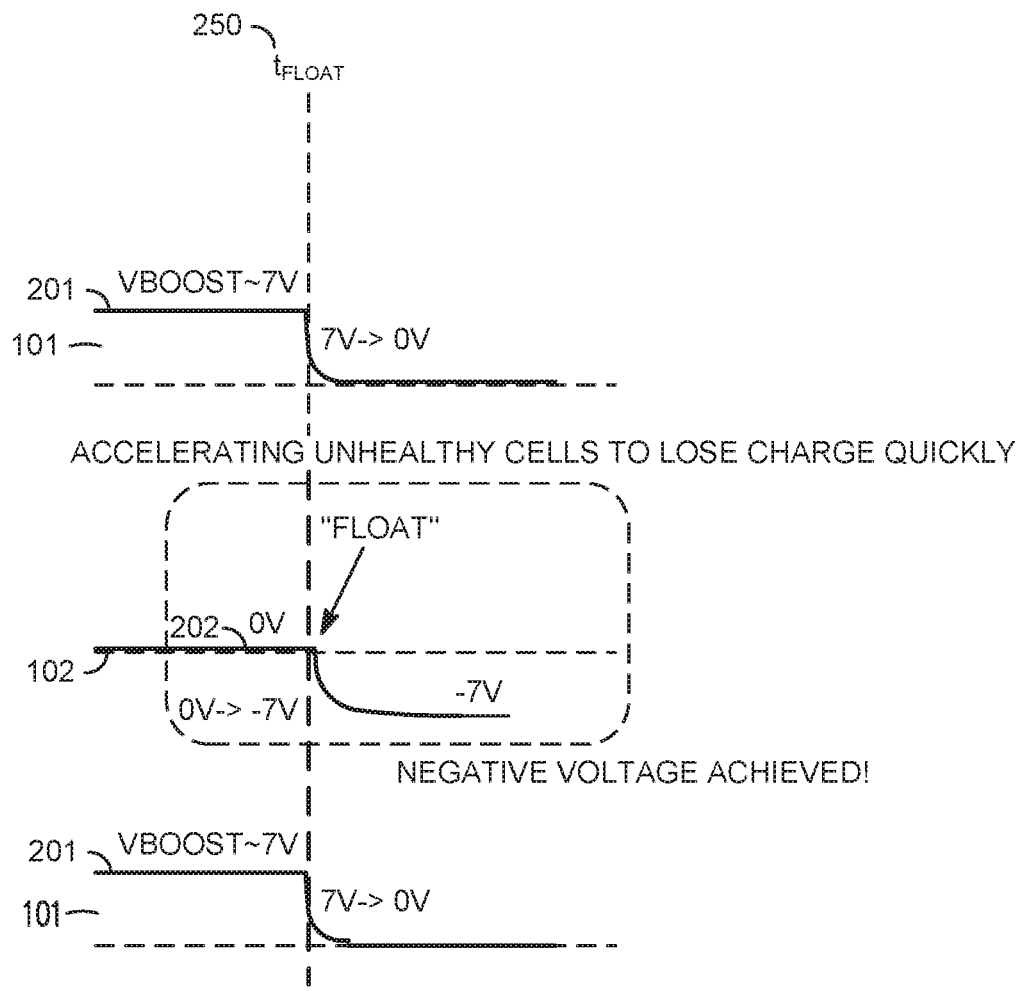
FIG. 2B shows a timing diagram for operating a nonvolatile memory according to an aspect of the present disclosure.

FIG. 2B shows a timing diagram 250 for driving a negative wordline voltage using the capacitive link between adjacent wordlines. Aspects of the present disclosure can drive a negative wordline voltage without using negative voltage circuitry. This timing 250 can be used to verify the charge states of memory cells in the NAND strings attached to the wordline. Wordlines 101 are boosted to a high voltage, e.g. seven volts. The wordlines 102, which are sandwiched between two wordlines 101 floats after being connected to zero volts, e.g., grounded. At time $t_{float}$, the wordline 102 is allowed to float and the wordlines 101 are driven to a low voltage, e.g., zero volts. Due to the capacitive effect, the wordline 102 is driven to a negative voltage. In an aspect, the voltage drop on the wordlines 101 induces an equivalent voltage drop on the wordline 102. The voltage on the wordline 102 can drop to negative seven volts. In an aspect of the disclosure, the voltage on wordline 102 drops to about negative five volts. This negative voltage on the wordline 102 will delete the charge in memory cells connected to wordline 102 that are only store charge just above the lower charge threshold or memory cells that are not adequately charged. While only two odd wordlines 101 and one even wordline are shown, it will be understood that a NAND memory device will include a multiple of memory cells and interleaved odd and even wordlines 101, 102. When the even wordlines are to be driven to a negative voltage, then the odd wordlines are driven to a high, positive level and then driven down to zero volts with the even wordlines floating to induce a negative voltage on the even wordlines. When the odd wordlines are to be driven to a negative voltage, then the even wordlines are driven to a high, positive level and then driven down to zero volts with the odd wordlines floating to induce a negative voltage on the odd wordlines.

Figure 3A:
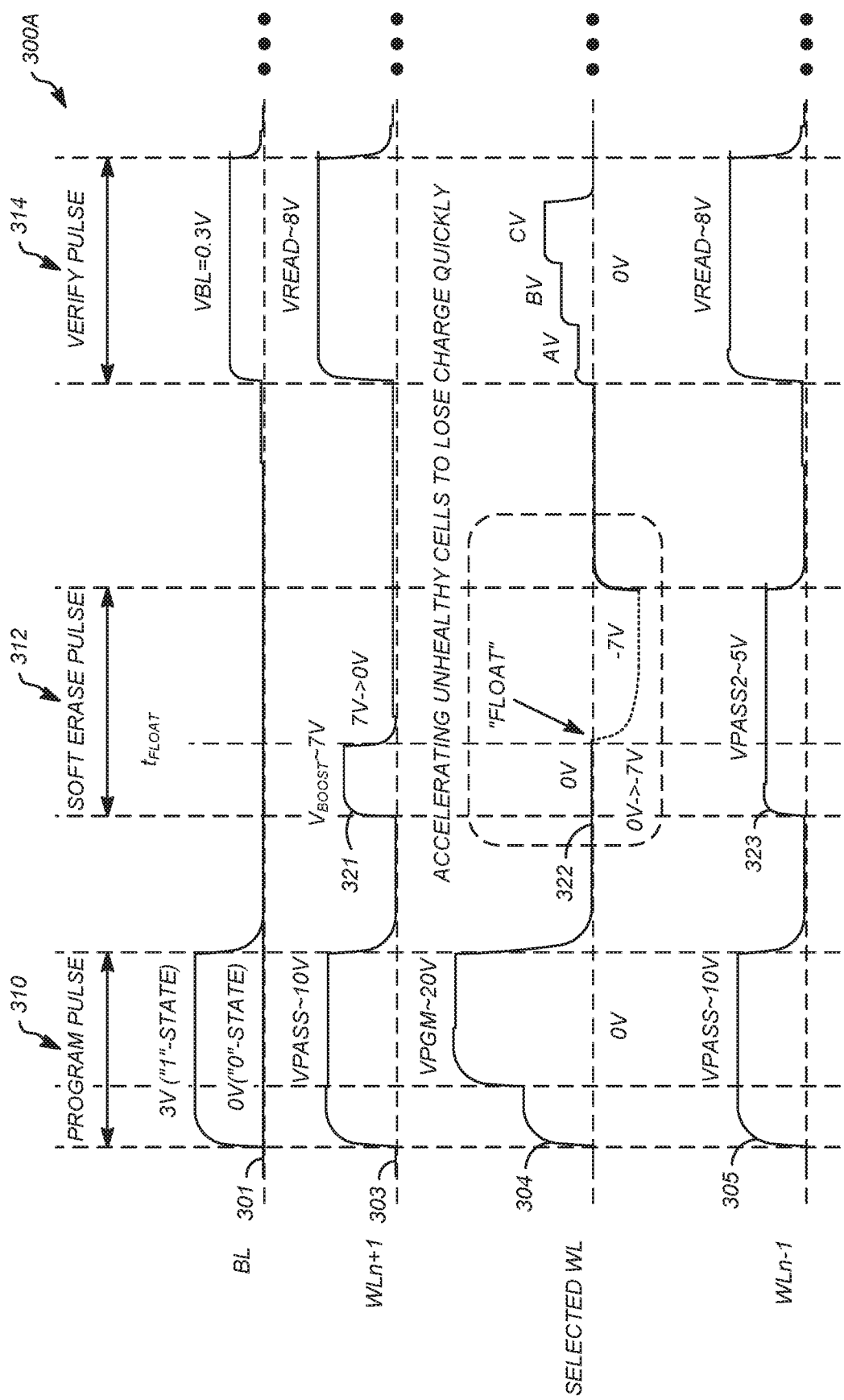
FIG. 3A shows a timing diagram for operating a nonvolatile memory according to an aspect of the present disclosure.

FIG. 3A shows the timing diagram 300A for program, soft erase, verify operations using a negative wordline voltage. Programming 310 drives charge into memory cells. The soft erase operation 312 will draw charge from unhealthy cells, e.g., those memory cells that do not contain sufficient electrical charge to remain in the memory state as required by the characteristics of the nonvolatile memory, e.g., a vertical NAND string. The verify pulse 314 operates to verify that the memory cell charged during the programming 310 has the stored charge. The bit line 301 at the program pulse 310 is placed at high voltage level, e.g., three volts, to select a memory cell to charge to a one state or placed a low voltage, e.g., zero volt, to select a memory cell to program the memory cell to a zero state. The wordlines that are not selected for programmed, here, wordlines 303, 305, are programmed to a pass voltage, e.g., ten volts. The selected wordline 304 is connected to the memory cell to be programmed. The programmed memory cell will be connected to the high bitline and the selected wordline 304. The program voltage on the wordline 304 is stepped to a high voltage level, e.g., twenty volts. At the end of the program pulse 310, the bitline 301 and wordlines 303-305 are dropped to zero volts.

After a time period, the soft erase 312 is applied. The soft erase 312 can be similar to that shown in FIG. 2B. The bitline 301 remains at zero volts. The non-selected wordline 303 is charged to a high, soft erase signal 321, e.g., positive seven volts. The selected wordline 304 is held at a zero-volt level 322. The other adjacent wordline 305 is driven to a pass voltage level, e.g., positive two to five volts. At time $t_{float}$, the wordline 303 signal 321 is dropped to zero volts, e.g., driven by control circuitry to zero volts. At time $t_{float}$, the selected wordline 304 is allowed to float, e.g., electrically disconnected from bias or drive circuitry. The other non-selected wordline 305 can remain at the pass voltage 323. The selected wordline will be driven to a negative voltage by the drop in the non-selected wordline 303. One wordline 303 drop in voltage can induce a negative voltage on the floated, selected wordline. At the end of the soft erase, the bitline 301 and wordlines 303-305 return to zero volts. The drop of the selected wordline 304 to a negative voltage will accelerate the unhealthy cells to lose their charge quickly, relative to prior soft erase methodology.

The verify pulse 314 operates to confirm that a memory cell has the charge state that was programmed into the memory cell. At the start of the verify operation, the bitline 301 is charged to a bitline verify voltage, e.g., 0.3 volts. The two non-selected wordlines 303, 305 are set to a read voltage, e.g., eight volts. The selected wordline 304 is stepped through multiple voltage levels to read the memory cell connected to the wordline 304 and bitline 301 to verify the charge level of the memory cell.

It will be appreciated that the negative voltage in the selected wordline is due to capacitive effect from the non-selected wordline while not being mechanically connected to the selected wordline. The selected and non-selected wordlines are not electrically connected to each other.

Figure 3B:
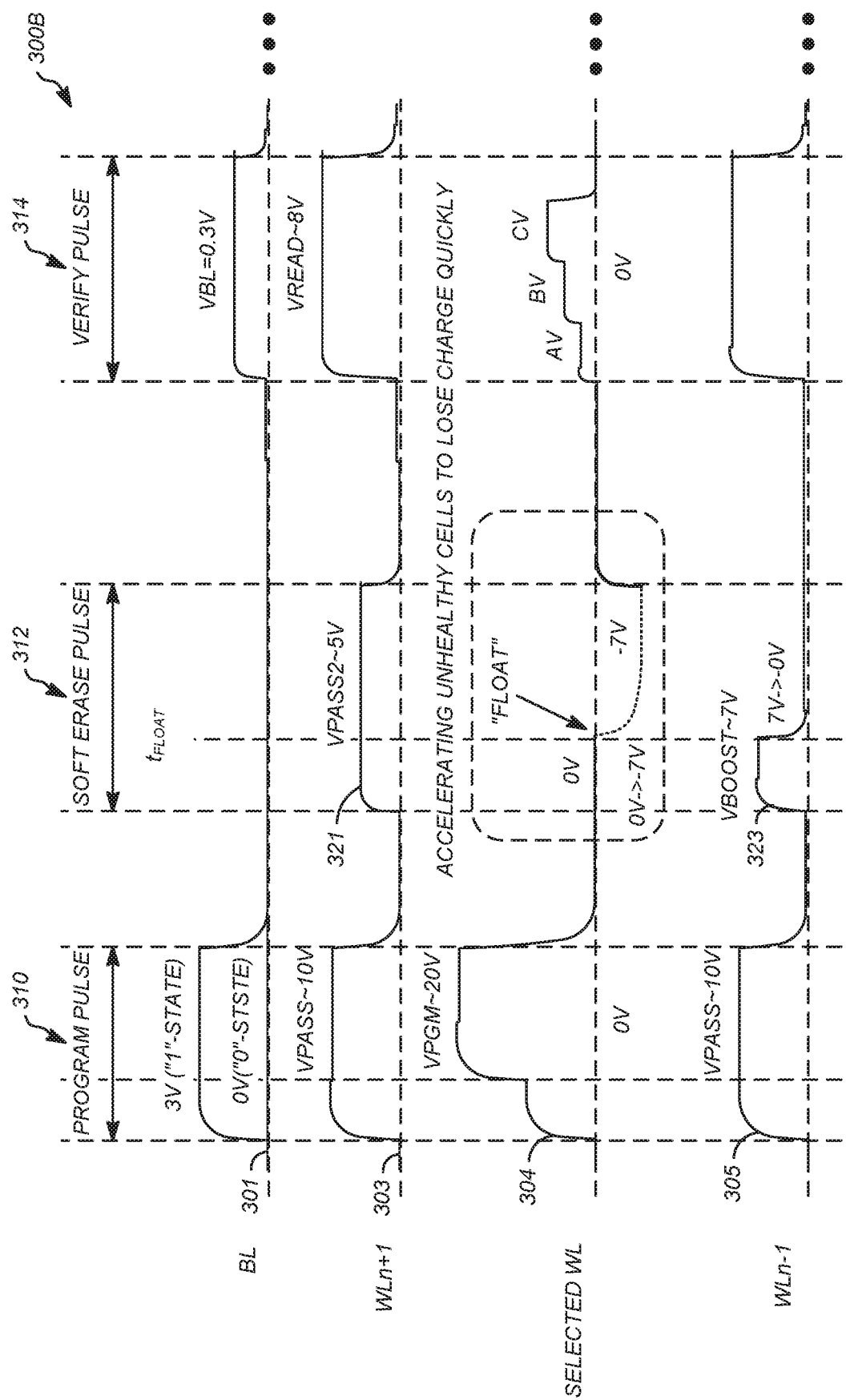
FIG. 3B shows a timing diagram for operating a nonvolatile memory according to an aspect of the present disclosure.

FIG. 3B shows the timing diagram 300B for program, soft erase, verify operations using a negative wordline voltage. Timing diagram 300B is similar to the timing diagram 300A but has the signals 321, 323 switching roles with the non-selected wordline 303. The non-selected wordline 303 is set at the pass voltage level 321 at a lower level than the signal 323 on the other non-selected wordline 303. The soft erase 312 can be similar to that shown in FIG. 2B. The bitline 301 remains at zero volts during soft erase. The non-selected wordline 305 is charged to a high, soft erase signal 323, e.g., positive seven volts. The selected wordline 304 is held at a zero-volt level 322. The other adjacent wordline 303 is driven to a pass voltage level, e.g., positive two to five volts. At time $t_{float}$, the wordline 305 signal 323 is dropped to zero volts, e.g., driven by control circuitry to zero volts. At time $t_{float}$, the selected wordline 304 is allowed to float, e.g., electrically disconnected from bias or drive circuitry. The other non-selected wordline 303 can remain at the pass voltage 321. The selected wordline 304 will be driven to a negative voltage by the drop in the non-selected wordline 305. One wordline 305 drop in voltage can induce a negative voltage on the floated, selected wordline 304. At the end of the soft erase, the bitline 301 and wordlines 303-305 return to zero volts. The drop of the selected wordline 304 to a negative voltage will accelerate the unhealthy cells to lose their charge quickly, relative to prior soft erase methodology.

Figure 4:
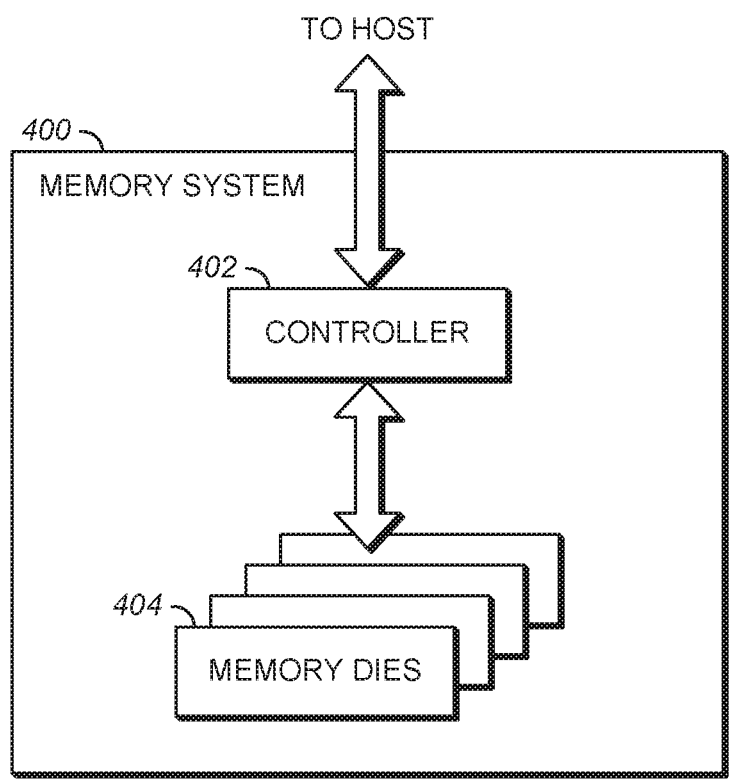
FIG. 4 generally illustrates a block diagram of an example memory system according to an aspect of the present disclosure.

FIG. 4 generally illustrates a block diagram illustrating a memory system 400. The memory system 400 may include a controller 402 and memory that may include or be made up of one or more memory dies 404. As used herein, the term die refers to the set of memory cells, and associated circuitry for managing the physical operation of those memory cells, that are formed on a single semiconductor substrate. The controller 402 may interface with a host system and transmit command sequences for read, program, and erase operations to the non-memory die(s) 404.

The controller 402 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 402 can be configured with hardware and/or firmware to perform the various functions described herein and generally illustrated in the timing diagrams. For example, the controller can control the erase verify signal levels and the soft erase signal levels on the odd and even wordlines in the non-volatile memory. Additionally, or alternatively, some of the components shown as being internal to the controller can also be stored external to the controller, and other components can be used. Additionally, or alternatively, the phrase "operatively in communication with" could mean directly in communication with or indirectly (wired or wireless) in communication with through one or more components, which may or may not be generally illustrated or described herein.

As used herein, the controller 402 is a device that manages data stored in the memory die(s) and communicates with a host, such as a computer or electronic device. The controller 402 can have various functionality in addition to the specific functionality described herein. For example, the controller 402 can format the memory dies 404 to ensure the memory dies 404 are operating properly, map out bad flash memory cells (e.g., by using the erase verify operations as described herein), and allocate spare cells to be substituted for future failed cells. Some part of the spare cells can be used to hold firmware to operate the controller 402 and implement other features. In operation, when a host needs to read data from or write data to the memory die(s) 404, the host will communicate with the controller 402. If the host provides a logical address to which data is to be read/written, the controller 402 can convert the logical address received from the host to a physical address in the memory die(s) 404. (Alternatively, the host can provide the physical address). The controller 402 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). The controller 402 can also control the erase verify operation as described herein. The memory die 404 includes the odd wordlines 101 and even wordlines 102 as described herein.

The interface between the controller 402 and the non-volatile memory die(s) 404 may be any suitable interface, such as flash interface, including those configured for Toggle Mode 200, 400, 800, 1000 or higher. For some example embodiments, the memory system 400 may be a card-based system, such as a secure digital (SD) or a micro secure digital (micro-SD) card. In alternate example embodiments, the memory system 400 may be part of an embedded memory system.

In the example illustrated in FIG. 4, the memory system 400 is generally illustrated as including a single channel between the controller 402 and the non-volatile memory die(s) 404. However, the subject matter described herein is not limited to memory systems having a single memory channel. For example, in some memory systems, such as those embodying NAND architectures, 2, 4, 8 or more channels may exist between the controller 402 and the memory die(s) 404, depending on controller capabilities. In any of the embodiments described herein, more than a single channel may exist between the controller and the memory die(s) 404, even if a single channel is shown in the drawings.

Figure 5:
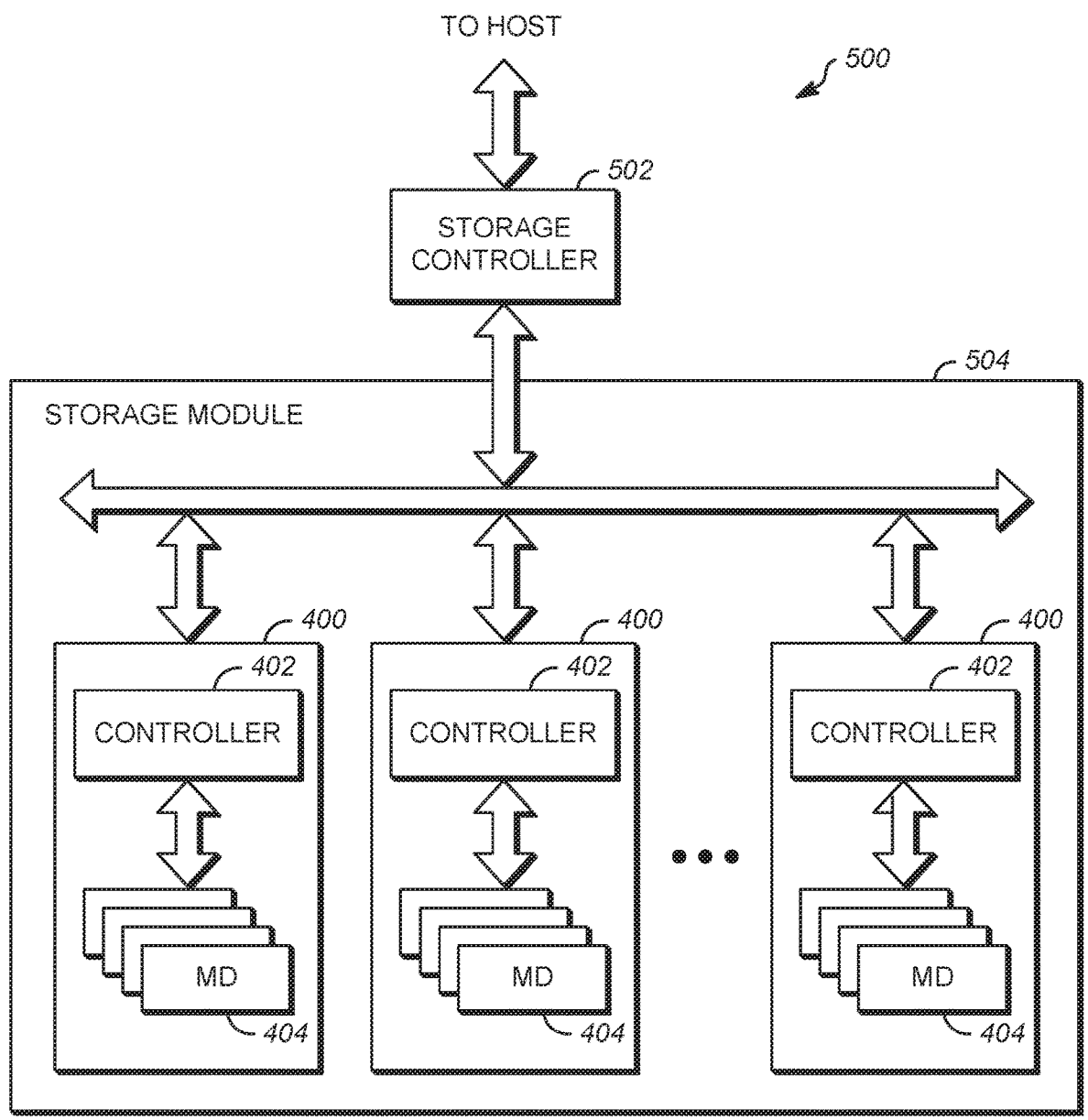
FIG. 5 generally illustrates a block diagram of an example storage module that includes a plurality of memory systems according to an aspect of the present disclosure.

FIG. 5 illustrates a storage module 500 that includes a plurality of non-volatile memory systems 400. As such, the storage module 500 may include a storage controller 502 that interfaces with a host and with a storage system 504, which includes a plurality of non-volatile memory systems 400. The interface between the storage controller 502 and non-volatile memory systems 400 may be a bus interface, such as a serial advanced technology attachment (SATA), a peripheral component interface express (PCIe) interface, an embedded Multimedia Card (eMMC) interface, a SD interface, or a Universal Serial Bus (USB) interface, as examples. The storage module 500, in one embodiment, may be a solid-state drive (SSD), such as found in portable computing devices, such as laptop computers and tablet computers, and mobile phones.

Figure 6:
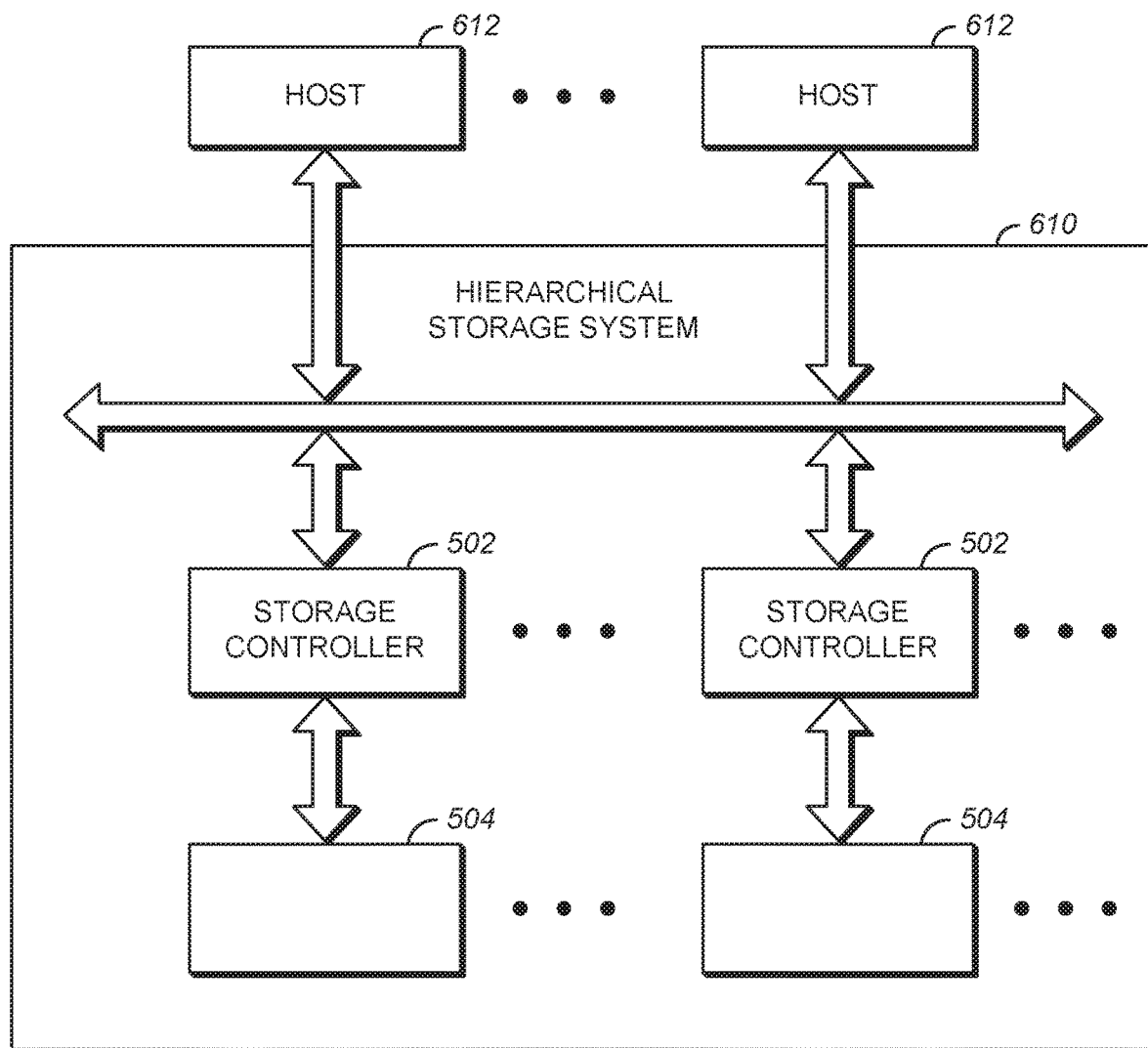
FIG. 6 generally illustrates a block diagram of an example hierarchical storage system.

FIG. 6 is a block diagram illustrating a hierarchical storage system 610. The hierarchical storage system 610 may include a plurality of storage controllers 502, each of which control a respective storage system 504. Host systems 612 may access memories within the hierarchical storage system 610 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 610 illustrated in FIG. 6 may be a rack mountable mass storage system that is accessible by multiple host computers, such as would be found in a data center or other location where mass storage is needed.

Figure 7:
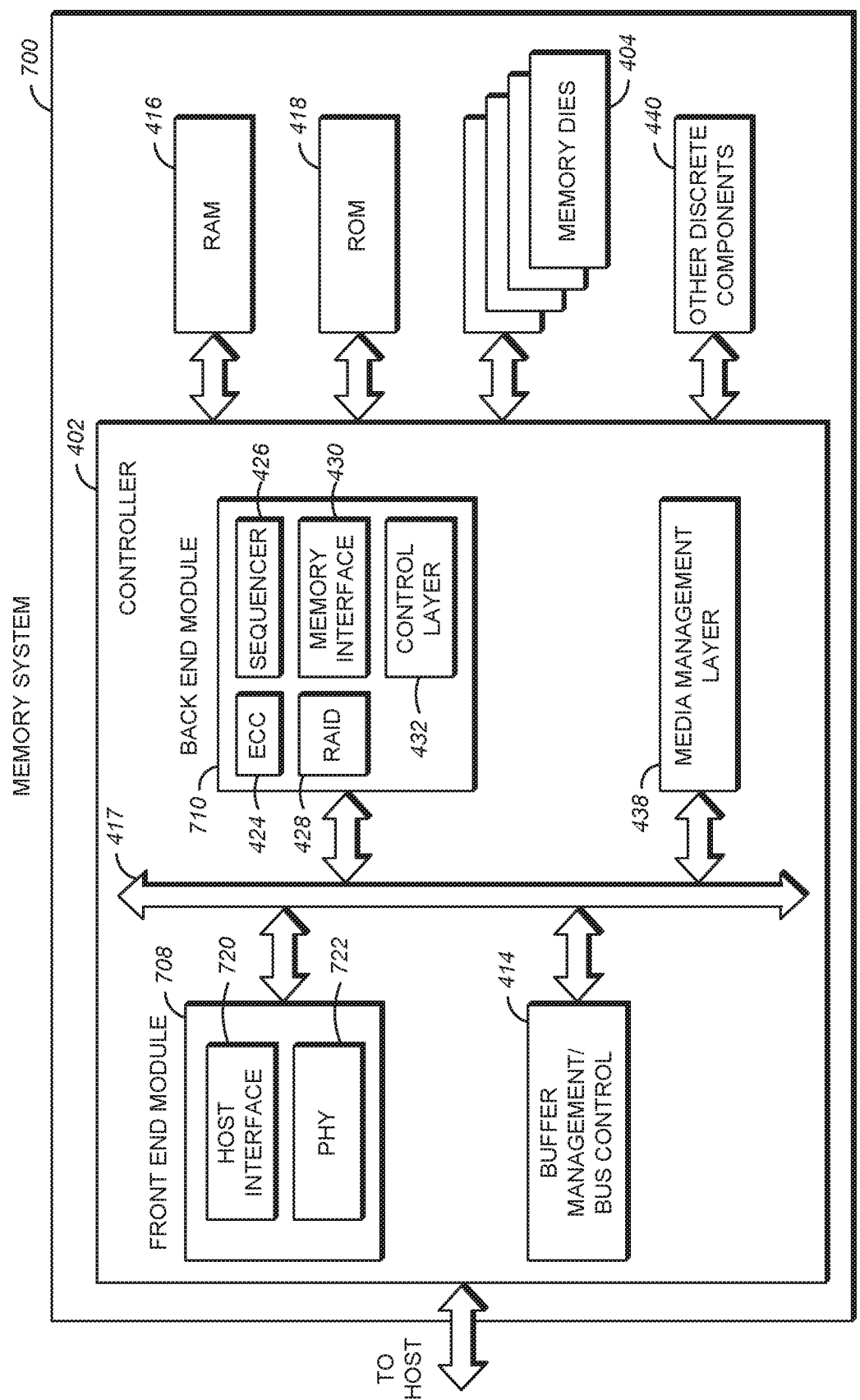
FIG. 7 generally illustrates a block diagram of an example configuration of components of a controller of the memory system of FIG. 4 according to an aspect of the present disclosure.

FIG. 7 is a block diagram illustrating exemplary components of the controller 402 in more detail. The controller 402 may include a front end module 708 that interfaces with a host, a back end module 710 that interfaces with the non-volatile memory die(s) 404, and various other modules that perform various functions of the non-volatile memory system 700. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the modules includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 402 may include a buffer manager/bus controller module 414 that manages buffers in random access memory (RAM) 416 and controls the internal bus arbitration for communication on an internal communications bus 417 of the controller 402. A read only memory (ROM) 418 may store and/or access system boot code. Although illustrated in FIG. 6 as located separately from the controller 402, in other embodiments one or both of the RAM 416 and the ROM 418 may be located within the controller 402. In yet other embodiments, portions of RAM 416 and ROM 418 may be located both within the controller 402 and outside the controller 402. Further, in some implementations, the controller 402, the RAM 416, and the ROM 418 may be located on separate semiconductor dies.

Additionally, or alternatively, the front-end module 708 may include a host interface 720 and a physical layer interface (PHY) 722 that provide the electrical interface with the host or next level storage controller. The choice of the type of the host interface 720 can depend on the type of memory being used. Example types of the host interface 720 may include, but are not limited to, SATA, SATA Express, SAS, Fibre Channel, USB, PCIe, and NVMe. The host interface 720 may typically facilitate transfer for data, control signals, and timing signals.

The back-end module 710 may include an error correction code (ECC) engine or module 424 that encodes the data bytes received from the host, and decodes and error corrects the data bytes read from the non-volatile memory die(s) 404. The back end module 710 may also include a command sequencer 426 that generates command sequences, such as program, read, and erase command sequences, to be transmitted to the non-volatile memory die(s) 404. Additionally, or alternatively, the back end module 710 may include a RAID (Redundant Array of Independent Drives) module 428 that manages generation of RAID parity and recovery of failed data. The RAID parity may be used as an additional level of integrity protection for the data being written into the non volatile memory system 700. In some cases, the RAID module 428 may be a part of the ECC engine 424. A memory interface 430 provides the command sequences to the non-volatile memory die(s) 404 and receives status information from the non-volatile memory die(s) 404. Along with the command sequences and status information, data to be programmed into and read from the non volatile memory die(s) 404 may be communicated through the memory interface 430. In one embodiment, the memory interface 430 may be a double data rate (DDR) interface and/or a Toggle Mode 200, 400, 800, or higher interface. A control layer 432 may control the overall operation of back end module 710.

Additional modules of the non-volatile memory system 700 illustrated in FIG. 7 may include a media management layer 438 that performs certain memory management functions such as wear leveling of memory cells of the memory dies 404, address management, and facilitates folding operations. Other memory management functions may be possible. The non-volatile memory system 400 may also include other discrete components 440, such as external electrical interfaces, external RAM, resistors, capacitors, or other components that may interface with the controller 402. In alternative embodiments, one or more of the RAID module 428, media management layer 438 and buffer management/bus controller 414 are optional components that may not be necessary in the controller 402.

Figure 8:
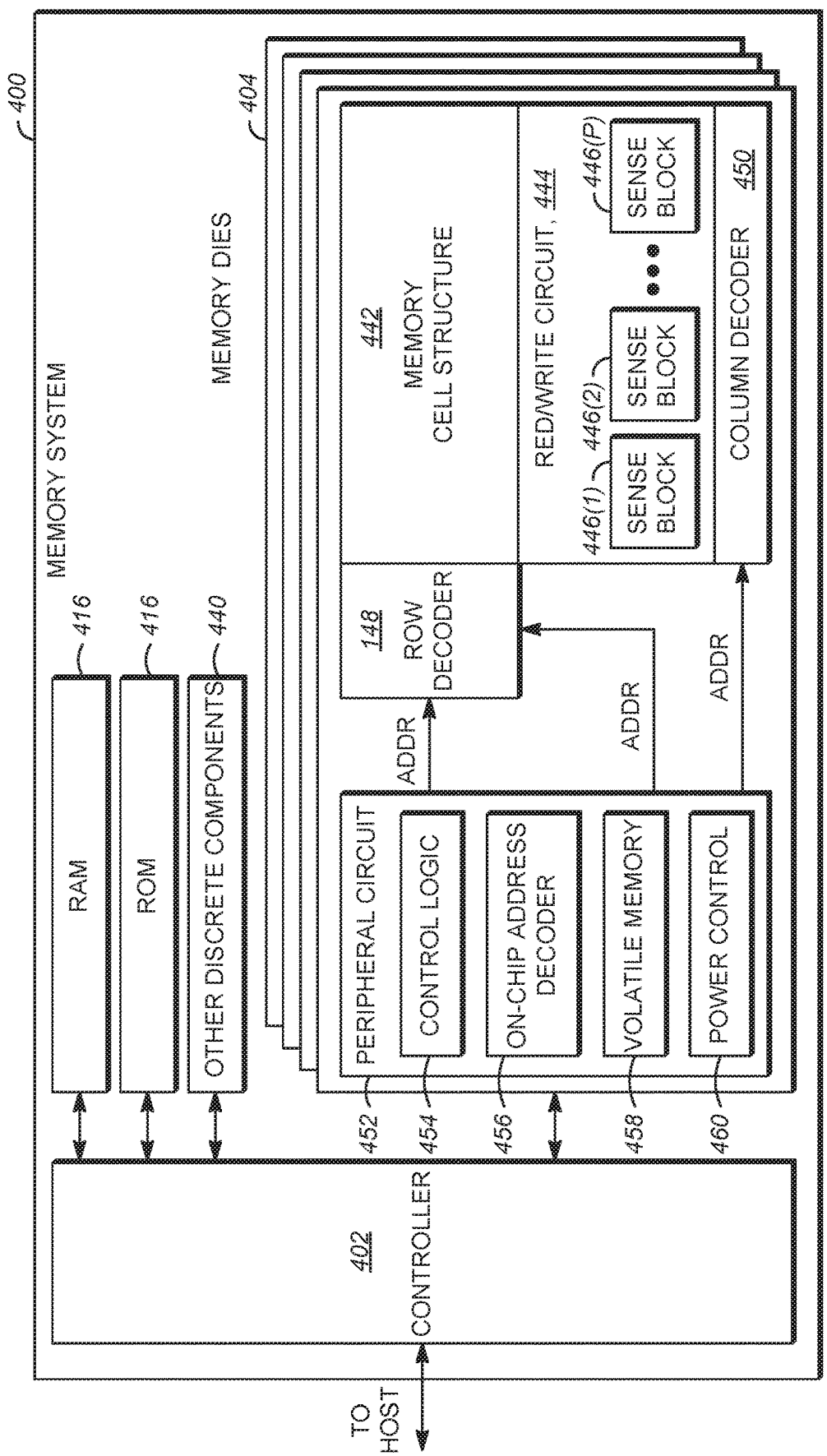
FIG. 8 generally illustrates a block diagram of an example configuration of components of a memory die of the memory system of FIG. 4 according to an aspect of the present disclosure.

FIG. 8 is a block diagram of an example configuration of components of a memory die 404 in more detail. The memory die 404 may include a memory cell structure 442 that includes a plurality of memory cells, otherwise or interchangeably referred to as memory elements. A memory cell is an element or component that stores a unit of data having an n-bit data value, where n is on or more. Any suitable type of memory can be used for the memory cells of the memory cell structure 442. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further, by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure 442 of a memory die may be located within and/or over a substrate. The substrate may be a wafer over, in which the layer of the memory cells are formed, or it may be a carrier substrate, which is attached to the memory cells after they are formed. As a non-limiting example, the substrate may include a semiconductor and/or be made of a semiconductor material, such as silicon.

In addition, a plurality of memory cells that form the entire memory cell structure 442, or at least a portion of the memory cell structure 442, may be arranged in two dimensions or in three dimensions. A plurality of memory cells arranged in two dimensions is referred to as a two-dimensional (2-D) memory cell structure. A plurality of memory cells arranged in three dimensions is referred to as a three-dimensional (3-D) memory cell structure.

In a two-dimensional memory cell structure, the memory cells are arranged in a single plane or a single memory device level. Typically, in a two dimensional memory cell structure, the memory cells are arranged in a plane (e.g., in an x-y direction plane) that extends substantially parallel to a major surface of a substrate that supports the memory cells.

In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate.

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the z direction) with each column having multiple memory cells in each column. The columns may be arranged in a two-dimensional configuration, e.g., in an x-y plane, resulting in a three-dimensional arrangement of memory cells, with the memory cells on multiple vertically stacked memory planes. Other configurations of memory cells in three dimensions can also constitute a three-dimensional memory array.

In at least some example configurations, a two-dimensional or a three-dimensional memory cell structure may be in the form of or configured as an ordered array (or just array). One type of an array is an orthogonal array, which is a matrix-like structure that includes rows and columns. The memory cells are arranged in the rows and columns. At the intersection of a row and a column is a memory cell. However, in other configurations, the memory cells may be arrayed in non-regular or non-orthogonal configurations.

Figure 9:
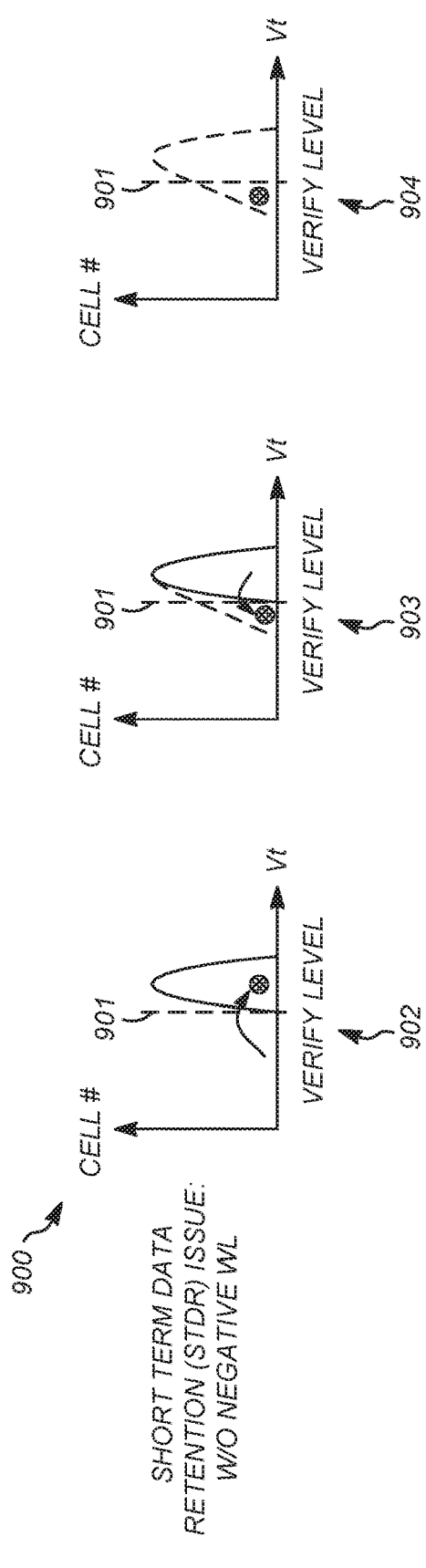
FIG. 9 generally illustrates a short-term data retention issue without a negative wordline voltage.

FIG. 9 schematically shows short term data retention (STDR) without using a negative wordline voltage 900. After programming, many memory cells are programmed immediately above verify level 901, see, graph 902. The graphs 902-904 show the cell number as a function of the threshold voltage $v_t$ for the cells. These memory cells are locked-out from further operation. However, due to short term data retention (STDR), those cells quickly lose charges and thus their threshold voltage (Vt) becomes lower than verify level 901 afterwards, 903. This eventually leads to "lower tail" of Vt distribution and causes fail bits at those memory cells, see graph 904. It is undesirable to have memory cells with charge below the voltage verify level.

Figure 10:
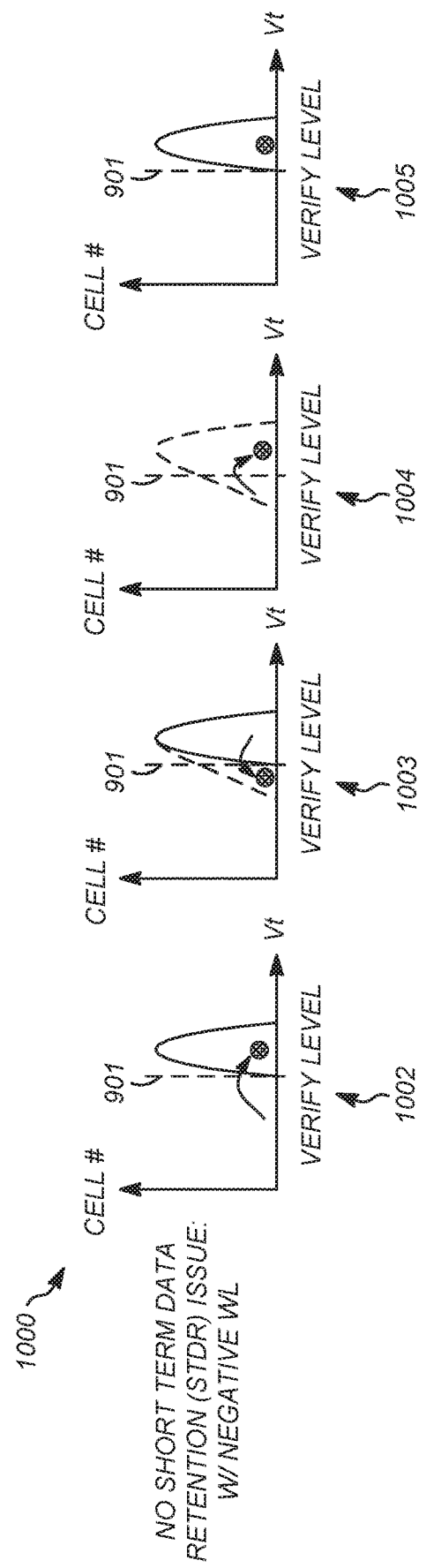
FIG. 10 generally illustrates a short-term data retention issue with a negative wordline voltage.

FIG. 10 schematically shows short term data retention (STDR) using a negative wordline voltage 1000. After programming, many memory cells are programmed immediately above verify level 901, see, graph 1002. The graphs 1002-1005 show the cell number as a function of the threshold voltage $v_t$ for the cells. These memory cells are locked-out from further operation. However, due to short term data retention (STDR), those cells quickly lose charges and thus their threshold voltage (Vt) becomes lower than verify level 901 afterwards, graph 1003. This eventually leads to "lower tail" of Vt distribution (to left of the verify level 901) and causes fail bits at those memory cells. The application of the soft erase with the negative wordline voltage fails the memory cell during verify and the programming process can be repeated to force more charge into these memory cells, see graph 1004. The memory cells are moved above the verify level 901 to an extent where the STDR is not an issue for those memory cells. It is undesirable to have memory cells with charge below the voltage verify level or ones that will drop below the verify level during the time period of the STDR period. Application of the additional charge, leads to a tighter Vt distribution especially the lower tail, see graph 1005.

The terms "top" and "bottom" are also used to refer to the relative positioning of components of the figures, usually in the z-direction and/or along the z-axis. In general, "bottom" components are positioned or disposed farther the z-direction from the bitlines 203 (FIG. 2A) and the "top" components are positioned or disposed closer in the z-direction to the bitlines 203.

Although the terms "upper" and "lower," "above" and "below," and "top" and "bottom" are used to describe the relative position of components in a nonvolatile memory, they should not be construed as limiting the relative positioning of the components since a memory die, or the memory system as a whole, can be oriented in any of various positions.

With respect to the components of a memory device, it includes a plurality of bias elements and a plurality of control lines. A bias element is a component or unit of a memory that receives, is biased with, and/or that responds to a bias. A bias, as used in conjunction with a bias element of a block, is a voltage, a current, a plurality of voltages, a plurality of currents, or a combination of at least one voltage and at least one current that is applied to and/or received by the bias element to cause a response from the bias element or configure the bias element in a particular state. A bias is applied or supplied to the bias element, or the bias element is biased with the bias, at one or more levels to induce a response or configure the bias element in a particular state in order for a memory operation to be carried out.

The plurality of bias elements of a block may all be of a single type or may each be one of a plurality of different types. Bias elements of different types may perform different functions in the block and/or may be biased with different biases at different levels during the memory operations.

One type of bias element is a memory cell. Memory cells that are part of the same block are referred to as a block of memory cells. Other types of bias elements may be possible, depending on the memory technology. In NAND technology, other types bias elements may include dummy cells, drain select gate transistors (referred to as SGD transistors), and source select gate transistors (referred to as SGS transistors). At least with NAND technology, dummy cells are memory cells that do not store data from a host, and are disposed coplanar with dummy word line layers that shield memory cells and word line layers from certain edge effects. SGD transistors and SGS transistors may be configured to enabled (turn on) and disabled or inhibited (turn off), or otherwise configured in conductive and non-conductive states, at certain time and/or in response to certain biases to allow memory operations to be performed—e.g., to allow data to be programmed into, read from, or erased from the memory cells. Bias element types other than or in addition to memory cells, dummy cells, SGD transistors, and/or SGS transistors may be possible. In an example embodiment, the SGST transistors are the switches 100, 200. In an example embodiment, the SGS transistors are the switches 100, 200.

In addition, a control line of a block is a conductive structure, element, or component of a block that supplies, applies, or outputs at least a part of a bias (such as a single voltage or a single current) to one or more bias elements of a block and/or that biases the one or more bias elements with at least part of the bias. In at least some example configurations, a control line functions as a contact line, in that it is the conductive line that physically extends to and contacts the one or more bias elements it biases, such as by contacting and/or forming at least a part of the electrodes or terminals of the bias element that it biases. The wordlines can be biased to the high level, a float level (no biasing), a zero (ground) level for an erase verify with the odd or even wordlines being used to drive the selected one of the odd or even wordlines to a negative state.

The control lines of a block in the memory device may be organized, arranged, characterized, divided, or configured into a plurality of different types of control lines. The control lines may be organized into types by the way that they bias the bias elements. For example, control lines of the same type may bias the bias elements in the same way, such as by biasing type of bias elements and/or the same types of terminals of the bias elements.

For NAND technology, the control lines of a block may be organized into three main types, including control gate lines, bit lines, and source lines. A bit line (at least for NAND technology) is a control line that applies a bit line voltage to one or more drain terminals (or just drain) of one or more bias elements, and/or that biases one or more drain terminals of one or more bias elements with a bit line voltage. In this context, the bit line voltage may alternatively be referred to as a drain voltage, where a bit line is a control line that applies a drain voltage to one or more drain terminals of one or more bias elements. In particular example configurations, a bit line biases drain terminals by applying its bit line voltage to one or more drain ends or sides of one or more channel element groups and/or associated channels, and/or by biasing one or more drain ends or sides of one or more channel element groups and/or associated channels with a bit line voltage. In this context, a bit line voltage may alternatively be referred to as a drain-side channel voltage (or just drain-side voltage). Herein, the terms bit line voltage, drain voltage, drain-side voltage, and drain-side channel voltage are used interchangeably, at least as those voltages pertain to NAND technology, unless expressly described otherwise. Channel element groups, channels, and their drain ends are described in further detail below.

A source line (at least for NAND technology) is a control line that applies a source line voltage to one or more source terminals (or just source) of one or more bias elements, and/or that biases one or more source terminals of one or more bias elements with a source line voltage. In this context, the source line voltage may alternatively be referred to as a source voltage, where a source line is a control line that applies a source voltage to one or more source terminals of one or more bias elements. In particular example configurations, a source line biases source terminals by applying its source line voltage to one or more source ends or sides of one or more channel element groups and/or associated channels, and/or by biasing one or more source ends or sides of one or more channel element groups and/or associated channels with a source line voltage. In this context, a source line voltage may alternatively be referred to as a source-side channel voltage or (or just source-side voltage). Herein, the terms source line voltage, source voltage, source-side voltage, and source-side channel voltage are used interchangeably, at least as those voltages pertain to NAND technology, unless expressly described otherwise. Additionally, or alternatively, the source line of a block may alternatively be referred to as a cell source line CELSRC. Channel element groups, channels, and their source ends are described in further detail below.

In at least some example configurations, control gate lines of a block may be further organized, arranged, characterized, divided, or configured into a plurality of different control gate types (or sub-types). In particular, the control gate lines may be further arranged into the types of bias elements that they bias, and include word lines, dummy word lines, drain select gate lines (referred to as SGD lines), and source select gate lines (referred to as SGS lines).

A word line is a control gate line that applies a word line voltage (e.g., the high level, the erase verify level or the low level) to one or more control gates of one or more memory cells, and/or that biases one or more control gates of one or more memory cells with a word line voltage. A dummy word line is a control gate line that applies a dummy word line voltage to one or more control gates of one or more dummy cells, and/or that biases one or more control gates of one or more dummy cells with a dummy word line voltage. A drain select gate line (referred to as an SGD line) is a control gate line that applies a drain select gate voltage (referred to as a SGD line voltage) to one or more control gates of one or more SGD transistors, and/or that biases one or more control gates of one or more SGD transistors with an SGD line voltage. A source select gate line (referred to as a SGS line) is a control gate line that applies a source select gate voltage (referred to as a SGS line voltage) to one or more control gates of one or more SGS transistors, and/or that biases one or more control gates of one or more SGS transistors with an SGS line voltage.

For some example configurations of a three-dimensional block, at least one type of control line is implemented or formed as a plurality of layers. For example, in at least some 3-D NAND configurations, the control gate lines of a block are implemented or formed as layers. In general, a layer, otherwise referred to as a sheet or a plate, is a generally planar structure extending in the x-y directions perpendicular to the z-direction. A layer has opposing planar surfaces facing in opposite directions. One of the planar surfaces is a top surface that faces in the z-direction away from the substrate 402, and the other planar surface is a bottom surface that faces in the z-direction toward the substrate 402.

Herein, the terms "line" and "layer," at least as they are used to refer to control lines except SGD lines as described in further detail below—are used interchangeably or as alternatives to each other. For example, the terms "control gate line" and "control gate layer" are used interchangeably; the terms "word line" and "word line layer" are used interchangeably; the terms "dummy word line" and "dummy word line layer" are used interchangeably; and the terms "source select gate line" (or SGS line) and "source select gate layer" (or SGS layer) are used interchangeably.

In addition, for at least for some example configurations of 3-D NAND technology, a three-dimensional block includes a stack. In general, a stack is a plurality or a collection of layers disposed on top of one another. For 3-D NAND, a stack of a block includes a plurality of control gate layers and a plurality of dielectric layers. A dielectric layer, at least when implemented with control gate layers of a stack, is a layer that electrically isolates one control gate layer from another control gate layer. In the stack, the control gate layers and the dielectric layers are arranged in an alternating manner, in that as the stack extends in the z-direction away from the substrate, the layers consecutively alternate between control gate layers and dielectric layers. In this context, a stack of a three-dimensional block is a collection of alternatingly disposed control gate layers and dielectric layers.

A stack of a three-dimensional block includes outer surfaces and edges as defined by the side surfaces and edges of the layers, as well as a top surface of a top-most layer of the stack and a bottom surface of a bottom-most layer of the stack. The outer surfaces and edges of the stack, in turn, define an outer boundary of the stack. The bias elements of the three-dimensional block are three-dimensionally arranged within the outer boundary. In this context, the bias elements of the three-dimensional block are referred to as being disposed in or within the stack.

In addition, at least for some example configurations, the bias elements of a three-dimensional block are disposed coplanar (in the x-y direction) with control gate layers. In particular, the bias elements are coplanar with the control gate layers by which they are configured to be biased. Accordingly, memory cells configured to be biased by a particular word line layer are disposed coplanar with the particular word line layer; SGD transistors configured to be biased by a particular SGD layer are disposed coplanar with the particular SGD layer; SGS transistors configured to be biased by a particular SGS layer are disposed coplanar with the particular SGS layer; and dummy cells configured to by biased by a particular dummy word line layer are disposed coplanar with the particular dummy word line layer.

A bias element that is coplanar with and/or configured to be biased by a given control gate layer may be referred to as being disposed in, located in, and/or coupled to the given control gate layer. For example, a memory cell coplanar with and/or configured to be biased by a given word line may be referred to as being disposed in, located in, and/or coupled to the given word line layer.

In addition, at least for some example configurations of 3-D NAND technology, a three-dimensional block includes a plurality of channels. A channel is an elongate structure that extends in the z-direction through a stack of a block, around or about which bias elements of the block are formed or disposed. A bias element that is disposed or formed around or about a channel may at least partially, and in some configurations completely, encompass or surround the channel.

In addition, at least for some example configurations of 3-D NAND technology, bias elements of a block are biased by way of channels. Otherwise stated, a channel is structure of a block by which bias elements are biased. In particular, drain terminals and source terminals of bias elements are biased by way of channels. A bias element that has its source and drain terminals biased by a given channel is coupled to that given channel.

Each channel includes a respective drain end (or drain side) and a respective source end (or source side). A channel extends through a stack in the z-direction toward the substrate from its drain end to its source end. Bit lines of a block are electrically connected or coupled the drain ends of the channels, and the source line of a block is electrically connected or coupled to the source ends of the channels. In a block, a bit line applies a bit line voltage (or drain voltage or drain-side voltage or drain-side channel voltage) to the one or more drain ends of one or more channels to which it is coupled. The source line applies a source line voltage (or source voltage or source-side voltage or source-side channel voltage) to the source ends of the channels to which it is coupled.

Additionally, or alternatively, as used herein, a channel element group is a plurality or a collection of bias elements that are formed or disposed around or about the same channel. A given channel and a given channel element group that includes the bias elements disposed or formed around or about the given channel are referred to as being coupled to and/or associated with each other. In addition, bias elements that are part of the same channel element group are referred as being coupled to each other.

For at least some example configurations, the bias elements of a channel element group include a plurality of memory cells, at least one SGD transistor, and at least one SGS transistor. In particular, example configurations, a channel element group may further include one or more dummy cells.

The channel element groups extend in the z-direction about their associated channels. Similar to the channels, the channel element groups each include respective drain ends (or drain sides) and source ends (or source sides). A channel extends in the z-direction toward the substrate from its drain end to its source end.

Drain ends of channel element groups are electrically coupled to drain ends of their associated channels. Accordingly, the bit lines are electrically connected or coupled to drain ends of channels and associated channel elements groups. A bit line is configured to apply a bit line voltage (or a drain voltage, a drain-side channel voltage, or a drain-side voltage) to drain ends of channels and associated channel element groups to which the bit line is coupled. Otherwise stated, a bit line voltage (or a drain voltage, a drain-side channel voltage, or a drain-side voltage) is a voltage that a bit line generates and that it applies to a drain end (or drain side) of a channel and/or a drain end (or drain side) of a channel element group to which it is electrically connected or coupled. During at least some memory operations, a bit line may bias one or more drain terminals of one or more bias elements by applying a bit line voltage (or a drain voltage, a drain-side channel voltage, or a drain-side voltage) to one or more drain ends of one or more channels and/or to one or more drain ends of one or more channel element groups to which it the bit line is electrically connected or coupled. Otherwise stated, during memory operations, a bit line biases one or more drain terminals of one or more bias elements with a bit line voltage (or a drain voltage, a drain-side channel voltage, or a drain-side voltage) by way of the drain ends of one or more channels and/or the drain ends of one or more channel element groups to which the bit line is coupled.

Similarly, source ends of channel element groups are electrically coupled to source ends of their associated channels. Accordingly, the source line is electrically connected or coupled to source ends of channels and associated channel elements groups. The source line is configured to apply a source line voltage (or a source voltage, a source-side channel voltage, or a source-side voltage) to source ends of channels and associated channel element groups to which the source line is coupled. Otherwise stated, a source line voltage (or a source voltage, a source-side channel voltage, or a source-side voltage) is a voltage that a source line generates and that it applies to a source end (or source side) of a channel and/or a source end (or source side) of a channel element group to which the source line is electrically connected or coupled. During at least some memory operations, a source line may bias one or more source terminals of one or more bias elements by applying a source line voltage (or a source voltage, a source-side channel voltage, or a source-side voltage) to one or more source ends of one or more channels and/or to one or more source ends of one or more channel element groups to which it the source line is electrically connected or coupled. Otherwise stated, during memory operations, a source line biases one or more source terminals of one or more bias elements with a source line voltage (or a source voltage, a source-side channel voltage, or a source-side voltage) by way of the source ends of one or more channels and/or the source ends of one or more channel element groups to which the source line is coupled.

In addition, bias elements of a channel element group extend in the z-direction around or about the same channel. Each bias element of the channel element group is disposed coplanar with one of the plurality of control gate layers of the block. In this regard, each control gate layer of the block is configured to bias a control gate of a respective one of the plurality of bias elements of the channel element group.

In addition, for at least some example configurations, the channel element groups of a block may have the same number of bias elements, the same combination of bias element types, and the same number of bias elements of each bias element type. Additionally, or alternatively, a bias element order in which the bias elements of their respective bias element types extend in the z-direction away from the substrate is the same among the channel element groups of a block. At least for some example configurations of 3-D NAND technology, the bias element order of the bias elements of a channel element group, starting closest to the substrate and moving away from the substrate in the z-direction, includes one or more SGS transistors followed by one or more source-side dummy cells, followed by a plurality of memory cells, followed by one or more drain-side dummy cells, and followed by one or more SGD transistors. Other bias element orders may be possible.

A control gate layer order of the control gate layers and their respective types may match or correspond to the bias element order of a block. Accordingly, at least for some example configurations of 3-D NAND technology, a control gate layer order of a plurality of control gate layers of a block, starting closest to the substrate and moving away from the substrate in the z-direction, includes one or more SGS layers, followed by one or more source-side dummy word line layers, followed by a plurality of word line layers, followed by one or more drain-side dummy word line layers, and followed by one or more SGD layers.

A single word line layer may include a plurality of word line cell groups, such that the memory cells disposed in a single word line layer are organized, arranged, or disposed into a plurality of word line cell groups (or strings). Memory cells coupled to the same word line layer but that are part of channel element groups having SGD transistors coupled to different SGD lines are part of different word line cell groups. In particular example configurations, the number of word line cell groups coupled to a single word line layer is equal to the number of SGD lines of a block. In addition, the number of memory cells of a single word line cell group may be equal to the m-number of bit lines BL1 to BLm, such that each memory cell of a word line cell group is electrically connected to a different one of the m-number of bit lines BL1 to BLm.

Additionally, or alternatively, the memory cells of a block or of the memory cell structure generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include 2, 3, or 4, although MLC cells that store more than 4 bits may be possible.

In general, certain collections of memory cells are configured to store the same number of bits. For example, memory cells that are part of the same word line cell group, part of the same block, or part of the same memory cell structure 442, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

In addition, a memory cell structure 442, including blocks and word line cell groups of the memory cell structure 442, may store data as pages. Herein, a page is a single unit of data that a single word line cell group of memory cells stores. The number of pages that a single word line cell group stores depends on the number of bits-per-cell that the memory cells of the single word line cell group are configured to store. As examples, a word line cell group of SLC cells is configured to store a single or one page of data; a word line cell group of MLC cells configured to store two-bits-per-cell is configured to store two pages of data; and a word line cell group of MLC cells configured to store three-bits-per-cell is configured to store three pages of data.

In addition, a memory cell structure 442 may store data according to one or more storage schemes. As used herein, a storage scheme is a general plan including a predefined set of actions and a predefined set of parameters that a memory system implements to store data. A given storage scheme for a particular collection of memory cells may identify or define the number of bits-per-cell that the memory cells of the particular collection are configured to store. The components of the memory system, including the circuit components on a given memory die, are configured to perform memory operations on the particular collection in accordance with the given storage scheme in order to program data into and/or read data from the particular collection of memory cells.

Memory cells of different memory technologies may store data in accordance with different storages schemes. In addition, memory cells of the same memory technology may store data in accordance with different storage schemes. For example, memory cells of the same memory technology but located in different memory systems, or in the same memory system but in different memory dies, or in different blocks or planes of the same memory die, or even different word line layers or different word line cell groups of the same block, may store data in accordance with different storage schemes, at least with respect to the number of bits-per-cell the different memory cells are configured to store.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

In addition, the same memory cell (or the same collection of memory cells) may be configured to store different numbers of bits-per-cell according to different storage schemes at different times. To illustrate, in one example, a memory cell may be configured as an SLC cell at one point in time, and then reconfigured as an MLC cell at a later point in time. As another example, a memory cell may be configured as an MLC cell at one point in time, and then reconfigured as an SLC cell at a later point in time. As another example, a memory cell may be configured as an MLC cell storing a first number of bits-per-cell at one point in time, and then reconfigured as an MLC cell storing a second number of bits-per-cell at a later point in time, where the first and second numbers are different from each other, with the first number being either less than or greater than the second number.

In addition, a memory cell stores data by having an associated storage parameter (alternatively or otherwise referred to as a characteristic, property, or feature) set to a level, value, magnitude, or state. The associated parameter is adjustable or variable, and can be controlled by biasing the control lines coupled to the memory cells at certain levels, at certain times, during certain memory operations, and according to certain storage schemes. Within one storage scheme defining a set of data values, a memory cell can store data at a certain one of the data values by having its storage parameter set to a level, value, magnitude, or state, or within a predetermined range of levels, values, magnitudes, or states. The level, value, magnitude, or state that the memory cell is at or set to corresponds to the data value of the set that the memory cell is storing. In addition, the memory cell can be configured to store a different value, or to change the data value of the data it is storing from one data value to another data value, by changing or adjusting the storage parameter to a different level, value, magnitude, or state.

The storage parameter that a memory cell has to store data depends on the memory technology, and can vary across different memory technologies. For NAND technology, the storage parameter is threshold voltage. At least with respect to NAND memory cells, a threshold voltage of a memory cell is a voltage applied to a control gate of the memory cell at which the memory cell becomes conductive. The level (otherwise referred to as the value or magnitude) of the threshold voltage depends on or is proportional to the amount of electrical charge that the memory cell is storing or trapping. The more charge that a memory cell is storing, the higher its threshold voltage, and the less charge that a memory cell is storing, the lower its threshold voltage. Accordingly, the data value that the memory cell is storing is set by setting the threshold voltage of the memory cell to a certain level, and the data value is adjusted or changed by changing the threshold voltage to a different level or within a different range of levels.

In addition, for NAND technology, the memory cells store data by being configured in memory states. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in upon being subjected to a program operation. At a given point in time, a memory cell may be in the erased state or one of the program states.

In addition, for a given storage scheme, each memory state has, corresponds to, or is associated with an associated range of threshold voltage levels, with each range being bounded by an upper threshold voltage level and a lower threshold voltage level. Otherwise stated, a given storage scheme may define a plurality of non-overlapping threshold voltage ranges, with each range being associated with or corresponding to a respective one of the plurality of memory states defined or identified by the given storage scheme. In turn, each range has, corresponds to, or is associated with a respective one of the data values. In this way, a storage scheme establishes a one-to-one correspondence between the threshold voltage ranges, the memory states, and the data values. Memory cells are programmed and read according to the one-to-one correspondence. That is, a memory cell configured with a threshold voltage level within a given threshold voltage range is configured in the memory state associated with the given threshold voltage range, and in turn is storing data having a data value that is associated with the given threshold voltage range and the corresponding memory state.

For particular embodiments, the erased state is associated with the lowest threshold voltage range. The program states are associated with consecutively or sequentially higher threshold voltage ranges from the range associated with the erased state.

In addition, the storage schemes may label or name the memory states in any of various ways, including alphabetically, numerically, or alphanumerically, as non-limiting examples. In particular example configurations, the erased state is called the erased state, and the program states are named with letters, numbers, or a combination thereof by associating higher letters in the alphabet or higher numbers with higher threshold voltage ranges. As illustrations, a memory state C is associated with a higher threshold voltage range than a memory state A, and a memory state 8 is associated with a higher threshold voltage range than a memory state 1. Various ways of labeling or naming memory states are possible.

In addition, memory states may be referred to as being higher memory states and lower memory states relative to each other. A first memory state is a higher memory state than a second memory state where the first memory state is associated with a higher threshold voltage range than the threshold voltage range with which the second memory state is associated. In addition, a first memory state is a lower memory state than a second memory state where the first memory state is associated with a lower threshold voltage range than the threshold voltage range with which the second memory state is associated.

In addition, the way in which the data values correspond to the memory states and/or the threshold voltage ranges may vary, and in particular, embodiments, how the data values correspond to or are assigned to the memory states and/or threshold voltage ranges may depend on a particular code scheme, such as the Gray code scheme, for example.

In implementation, a collection of memory cells programmed into the same memory state may have an associated collection of threshold voltage as a result of the programming. The threshold voltages may be represented as a threshold voltage probability distribution, or just threshold distribution of the number of memory cell in the collection as a function of threshold voltage.

A given storage scheme may have a model, reference, ideal, or target threshold voltage distribution, which may be in the form of a continuous probability distribution, such as a Gaussian distribution, for example, for each of the memory states and associated threshold voltage ranges defined by the given storage scheme. A model threshold voltage distribution may represent a model of an ideal threshold voltage distribution for a collection of memory cells programmed into the same memory state to have. The lower and upper tails of the model threshold voltage distributions may align or correspond to the upper and lower threshold voltage levels of the ranges with which each of the model threshold voltage distributions is associated.

In addition, the memory as described herein may include a power control circuit that is configured to generate and supply control line voltages (including voltage pulses) to control lines of the memory cell structures. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit also be configured to generate and/or supply voltages other than the control lines voltages, including other voltages that may be supplied to the memory cell structure, the read/write circuits, the sense blocks, and/or other circuit components on the memory die 404.

The power control circuit may include any of various circuit topologies or circuit configurations to generate and/or supply the voltages at appropriate levels to perform memory operations, (including read, program/write, sense, verify and erase operations), such as driver circuits, current sources, charge pumps, reference voltage generators, regulators, and pulse generation circuits, or any of various combinations thereof. Other types of circuits to generate the voltages may be possible. In addition, the power control circuit may communicate with and/or be controlled by the control logic circuit, the read/write circuits, and/or the sense blocks in order to supply the voltages at appropriate levels and at appropriate times to carry out the memory operations.

During read operations, the power control circuit may bias word lines at read threshold voltage levels Vr in order to read the data values of the data that the memory cells are storing. A threshold voltage level Vr for a given memory state may have different optimum values for different operating conditions, including different process conditions, different program/erase cycles, different retention times, different temperatures, different disturb conditions, or combinations thereof. For a given storage scheme, the memory system, at the controller side, and/or at the memory die side, may maintain a data structure, such as a table, that identifies one or more sets of read threshold levels for the power control circuit to use to bias the word lines during read operations. The data structure may include multiple sets of read threshold levels; each corresponding to a different area of the memory dies 404.

The memory system 400 may be configured to perform a read threshold calibration process that updates or revises one or more sets of the read threshold levels maintained in the data structure to more optimal values corresponding to changes in operating conditions. In various embodiments described herein, the read threshold calibration process that the memory system 400 performs may be based on bit error rates (BERs) determined from data read from the memory dies 404. The data read from the memory dies 404 to perform the calibration may be performed in response to host read requests. In addition or alternatively, the calibration may be a continuous process, such as a process continuously performed as host read requests are received, rather than as a discrete background process triggered by a certain metric, such as program/erase cycle count, as an example. Also, the calibration process may leverage the way in which the read/write circuit reads data based on pages (e.g., lower, middle, upper) in order to determine voltage bins across a threshold voltage range over which the threshold voltage distribution curves extend, and BERs for those bins. Based on the determined BERs, the memory system 400 may determine in which direction to shift a read voltage level (increase or decrease), and by how much.

In further detail, the read/write circuit may execute a read operation to read one or more pages of data from the memory dies 404. To do so, the read/write circuit may execute the read operation in a sequence of stages dependent on the page types. For example, to read data from a page of MLC cells configured to store two bits-per-cell, the read/write circuit may read the lower page first in a first stage, and then the upper page in a second stage. As another example, to read data from a page of MLC cells configured to store three bits-per-cell, the read/write circuit may read the lower page first in a first stage, then the middle page in a second stage, and then the upper page in a third stage.

To read a given page, sense circuits of the sense blocks, coupled to the memory cells storing the page, perform a predetermined number of sense operations, each with the word lines coupled to the memory cells biased at an associated one of the read threshold voltage levels Vr. For an SLC storage scheme, the power control circuit biases the word lines with the threshold voltage VrA associated with program state A, and the sense circuits perform a single sense operation. In response to the sense operation, the sense circuits identify those SLC cells in the erase state Er as storing a logic 1 value, and identify those SLC cells in memory state A as storing a logic 0 value. The erase verify may use the wordline charging methods are described herein.

For MLC storage schemes, to read a given page, sense circuits coupled to the memory cells storing the page perform multiple sense operations, such as two, three, or four sense operations, each with the word lines biased at a different one of the read threshold voltage levels Vr. The read threshold levels Vr that are applied depend on how many bits-per-cell the MLC cells are storing, which page is being read, and which number sense operation is being performed. In one example three bits-per-cell MLC storage scheme, to read a lower page, the sense circuits perform two sense operations, including a first sense operation with the word lines biased at the read threshold level VrA associated with memory state A, and a second sense operation with the word lines biased at the read threshold level VrE associated with memory state E. Read threshold voltage levels VrA and VrE applied during first and second sense operations.

The present disclosure includes methods and systems for erase verify operation in nonvolatile memory. The disclosure provides driving one of a plurality of odd wordlines and a plurality of even wordlines to a high voltage. The other of plurality of odd wordlines and a plurality of even wordlines is the selected wordline for an erase and verify operation and is floated. The term "floating" can mean that the selected wordline is not biased or not electrically connected to another circuit element. The high voltage level is brought down to zero. Through capacitance between the one wordline and the selected wordline, the selected wordline, which starts at zero volts, goes below zero. The wordline dropping negative can accelerate charge loss on unhealthy memory cells Memory devices, like most semiconductor devices, continue to shrink in size to pack more circuits per chip. In memory devices there may be many of the same size conductive paths adjacent one another, which are constantly being moved closer together. This results in a greater signal delay along one of the conductive paths due to capacitance between the conductive paths, i.e., $C=(\varepsilon *A)/d$, where C is capacitance is farads, c is permittivity of the dielectric, A is the area of the plate overlap, and d is the distance between the plates. As the capacitive effects increase, the RC delay may also increase. This is true for wordlines as they are typically aligned directly over one another in the z direction and have the same dimensions in the x and Y directions. Moreover, wordlines in non-volatile memories separated from one another by less than 50 nm, and can be in the range of about 25-30 nm. This increases the capacitive effect between adjacent wordlines. This adds to the ability of the present methods and systems to drive a selected wordline to a negative voltage using its capacitive coupling to the adjacent wordlines.

The present disclosure describes achieving a negative voltage level on a selected wordline without using a negative voltage generator circuit connected to the wordline. Negative voltage generator circuitry is disfavored as such circuitry takes up valuable real estate on the die. Conventional nonvolatile memory only generates positive voltage bias on chip for all operations including erase/program/read. Negative WL (NWL) biasing is a concept of generating negative voltage on the nonvolatile memory (e.g., NAND) chip. Generally, this is not a design friendly concept because "triple well" technology is needed, and it is very costly to fabricate. Accordingly, negative voltage generators are not implemented. However, from device/cell operational perspective, "negative voltage" biasing can be beneficial. One of the benefits comes from the period between program pulse and verify pulse during programming event. Conventional operations without negative NWL biasing results in, after programming, many cells are programmed immediately above verify level and they are locked-out from further operation. However, due to short term data retention (STDR), those cells quickly lose charges and thus their threshold voltage (Vt) becomes lower than verify level afterwards. This eventually leads to "lower tail" of Vt distribution and causes fail bits. Use of NWL biasing, after programming and before verify, introduces a negative pulse on the selected wordline, which accelerates the charge loss of those "defective" cells. Then during verify, those cells are judged as "not pass" and thus can get an extra program pulse to compensate the charge loss effect. This eventually leads to a tighter Vt distribution especially the lower tail for these memory cells.

Figure 11:
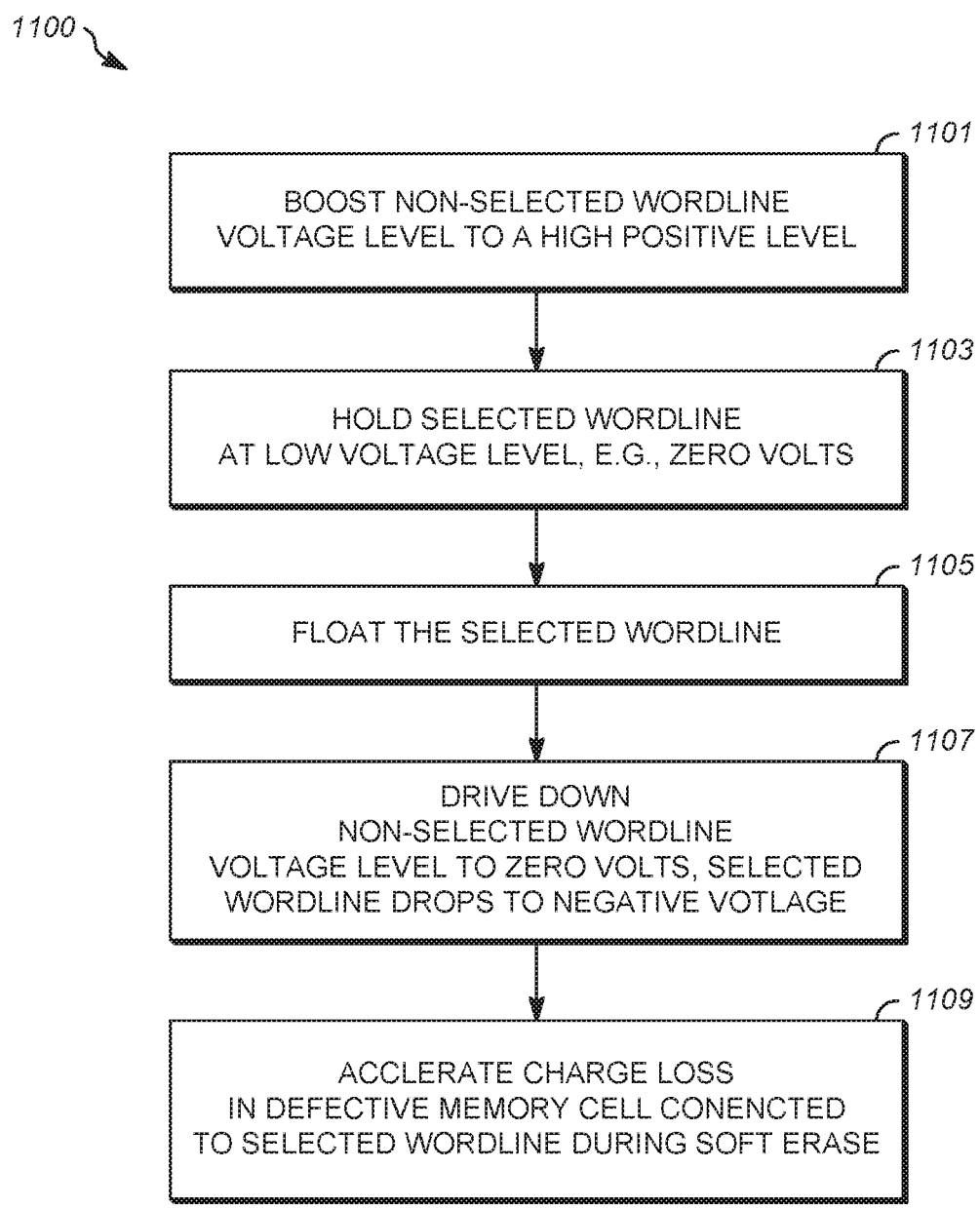
FIG. 11 generally illustrates a flow chart of a method for operating a nonvolatile memory according to an aspect of the present disclosure.

FIG. 11 shows a flow chart 1100 for a method for using negative wordline voltage to fail a memory cell that may be subject to short term data retention issues in a non-volatile memory. At 1101, a non-selected wordline is boosted to a first positive voltage, which is a high voltage. At 1103, a selected wordline is held at zero volts. The selected wordline is directly adjacent the non-selected wordline and capacitively coupled to the non-selected wordline. At 1105, the selected wordline is held at low voltage, zero volts. Holding the selected wordline at zero volts may delay the non-selected wordline from reaching its voltage level. The selected wordline is then allowed to float. At 1107, the non-selected wordline is driven to a lower voltage to shift the selected wordline to less than zero volts due to capacitance effects. At 1109, the charge loss in a defective memory cell connected to the selected wordline while at a negative voltage during a soft erase operation.

The present disclosure can provide an equivalent negative voltage method without negative voltage generator circuitry. The presently described technique utilizes neighbor WL-WL capacitive coupling effect to couple down the selective WLs to a negative voltage without using negative pump circuitry. The structures and methods described herein don't require an increase in complexity or cost, e.g., incorporating triple well structures, but can achieve STDR correction and improve Vt margin.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

What is claimed is:

1. A method for non-volatile memory, comprising:
   boosting a non-selected wordline to a first positive voltage;
   holding a selected wordline at zero volts, the selected wordline being adjacent to the non-selected wordline and being capacitively coupled to the non-selected wordline;
   floating the selected wordline; and
   during a soft erase operation, shifting the selected wordline to a negative voltage due to capacitance effects by driving the non-selected wordline to a voltage lower than the first positive voltage, thereby
   accelerating charge loss in a defective memory cell connected to the selected wordline.

2. The method of claim 1, further comprising applying a program pulse to the defective memory cell at an increased level.

3. The method of claim 1,
   wherein the boosting comprises boosting sequential odd non-selected wordlines to the first positive voltage,
   wherein the floating comprises floating an even wordline that is intermediate between the sequential odd non-selected wordlines as the selected wordline, and
   wherein the shifting comprises driving both the sequential odd non-selected wordlines to the voltage lower than the first positive voltage, thereby shifting the selected wordline to the negative voltage.

4. A method for non-volatile memory, comprising:
   issuing a program command to control a bitline associated with a memory cell connected to an even selected wordline;
   driving odd non-selected wordlines, which are sequential and adjacent to the selected wordline and are capacitively coupled to the even selected wordline, to a pass voltage, thereby stepping the even selected wordline to a program voltage;
   returning the odd non-selected wordlines and the even selected wordline to zero volts;
   boosting the odd non-selected wordlines to a first positive voltage;
   holding the even selected wordline at zero volts;
   floating the even selected wordline; and
   during a soft erase operation, shifting the even selected wordline to less than zero volts due to capacitance effects by driving at least one of the odd non-selected wordlines to a voltage lower than the first positive voltage, thereby accelerating charge loss in a defective memory cell connected to the even selected wordline.

5. The method of claim 4, further comprising verifying an erase after accelerating the charge loss in the defective memory cell.

6. The method of claim 1,
   wherein the boosting comprises boosting sequential odd non-selected wordlines to the first positive voltage,
   wherein the floating comprises floating an even wordline that is intermediate between the sequential odd non-selected wordlines as the selected wordline, and
   wherein the shifting comprises:
      driving a first one of the sequential odd non-selected wordlines to zero volts, thereby shifting the selected wordline to the negative voltage, and
      driving a second one of the sequential odd non-selected wordlines to a voltage less than the first positive voltage and greater than zero.

7. The method of claim 6, wherein the boosting the sequential odd non-selected wordlines comprises boosting the first one of the sequential non-selected off wordlines to at least seven volts.

8. The method of claim 7, further comprising shifting the even-selected wordline down to more than five volts while not connected to driver circuitry.

9. A non-volatile memory, comprising:
   a plurality of even wordlines;
   a plurality of odd wordlines alternating with ones of the plurality of even wordlines;
   a plurality of memory cells in a vertical stack connected to the plurality of even wordlines and the plurality of odd wordlines;
   a bit line connected at one end of the vertical stack of memory cells; and
   controller circuitry configured to issue signals thereby:
      boosting a non-selected wordline to a first positive voltage;
      holding a selected wordline at zero volts, the selected wordline being adjacent to the non-selected wordline and being capacitively coupled to the non-selected wordline;
      floating the selected wordline; and
      during a soft erase operation, shifting the selected wordline to a negative voltage due to capacitance effects by driving the non-selected wordline to a voltage lower than the first positive voltage, thereby accelerating charge loss in a defective memory cell connected to the selected wordline.

10. The memory of claim 9, wherein the controller is further configured to issue control signals thereby applying apply a program pulse to the defective memory cell at an increased level.

11. The memory of claim 9, wherein the controller is further configured to issue control signals such that:
   the boosting comprises boosting sequential odd non-selected wordlines to the first positive voltage,
   the floating comprises floating an even wordline that is intermediate between the sequential odd non-selected wordlines as the selected wordline, and
   the shifting comprises driving both the sequential odd non-selected wordlines to the voltage lower than the first positive voltage, thereby shifting selected wordline to the negative voltage.

12. A non-volatile memory, comprising
   a plurality of even wordlines;
   a plurality of odd wordlines alternating with ones of the plurality of even wordlines;
   a plurality of memory cells in a vertical stack connected to the plurality of even wordlines and the plurality of odd wordlines;
   a bit line connected at one end of the vertical stack of memory cells; and
   controller circuitry configured to issue signals thereby:
      issuing a program command to control a bitline associated with s memory cell connected to an even selected wordline,
      driving odd non-selected wordlines, which are sequential and adjacent to the selected wordline and are capacitively coupled to the even selected wordline, to a pass voltage, thereby stepping
      the even selected wordline to a program voltage,
      returning the odd non-selected wordlines and the even selected wordline to zero volts,
      boosting the odd non-selected wordlines to a first positive voltage, holding the even selected wordline at zero volts, floating the even selected wordline, and during a soft erase operation, shifting the even selected wordline to less than zero volts due to capacitance effects by driving at least one of the odd non-selected wordlines to a voltage lower than the first positive voltage, thereby accelerating charge loss in a defective memory cell connected to the even selected wordline.

13. The memory of claim 12, wherein the controller is further configured to verify an erase after accelerating the charge loss in the defective memory cell.

14. The memory of claim 9, wherein:

the boosting comprises boosting sequential odd non-selected wordlines to the first positive voltage, the floating comprises floating an even wordline that is intermediate between the sequential odd non-selected wordlines as the selected wordline, and the shifting comprises:

driving a first one of the sequential odd non-selected wordlines to zero volts thereby shifting the selected wordline to the negative voltage, and driving a second one of the sequential odd non-selected wordlines to a voltage less that the first positive voltage and greater than zero.

15. The memory of claim 14, wherein the boosting comprises boosting the first one of the sequential non-selected wordlines to at least seven volts.

16. The memory of claim 15, wherein the selected wordline is shifted down to more than five volts while not connected to driver circuitry.

\* \* \* \* \*